(12) United States Patent
Chattopadhyay et al.

(10) Patent No.: US 8,317,923 B1
(45) Date of Patent: Nov. 27, 2012

(54) PROTECTIVE SELF-ALIGNED BUFFER LAYERS FOR DAMASCENE INTERCONNECTS

(75) Inventors: Kaushik Chattopadhyay, San Jose, CA (US); Bart van Schravendijk, Sunnyvale, CA (US); Yongsik Yu, Lake Oswego, OR (US); Mandyam Sriram, Beaverton, OR (US)

(73) Assignee: Novellus Systems, Inc., San Jose, CA (US)

( * ) Notice: Subject to any disclaimer, the term of this patent is extended or adjusted under 35 U.S.C. 154(b) by 273 days.

(21) Appl. No.: 12/762,223

(22) Filed: Apr. 16, 2010

Related U.S. Application Data

(60) Division of application No. 11/709,294, filed on Feb. 20, 2007, now Pat. No. 7,727,880, which is a continuation-in-part of application No. 10/980,076, filed on Nov. 3, 2004, now Pat. No. 7,396,759.

(51) Int. Cl.
*C23C 16/00* (2006.01)
*C23F 1/00* (2006.01)
*H01L 21/306* (2006.01)
(52) U.S. Cl. .................. 118/719; 118/697; 414/939
(58) Field of Classification Search .............. 118/719, 118/697; 427/255.5; 438/653; 414/939
See application file for complete search history.

(56) References Cited

U.S. PATENT DOCUMENTS

| | | | |
|---|---|---|---|
| 4,282,268 A | 8/1981 | Priestley et al. | |
| 5,447,887 A | 9/1995 | Filipiak et al. | |
| 5,975,740 A * | 11/1999 | Lin et al. ................ | 700/99 |
| 6,143,657 A | 11/2000 | Liu et al. | |
| 6,153,523 A | 11/2000 | Van Ngo et al. | |
| 6,181,013 B1 | 1/2001 | Liu et al. | |
| 6,271,595 B1 | 8/2001 | McGahay et al. | |
| 6,518,167 B1 | 2/2003 | You et al. | |
| 6,573,604 B1 | 6/2003 | Kajita | |
| 6,750,541 B2 | 6/2004 | Ohtsuka et al. | |
| 6,777,323 B2 | 8/2004 | Kakamu | |

(Continued)

FOREIGN PATENT DOCUMENTS

CN         102130046         7/2011

(Continued)

OTHER PUBLICATIONS

U.S. Appl. No. 11/709,293, filed Feb. 20, 2007, Entitled "Protective Self-Aligned Buffer Layers for Damascene Interconnects".

(Continued)

*Primary Examiner* — Karla Moore
(74) *Attorney, Agent, or Firm* — Weaver Austin Villeneuve & Sampson LLP

(57) ABSTRACT

Protective self aligned buffer (PSAB) layers are layers of material that are selectively formed at the surface of metal layers in a partially fabricated semiconductor device. In a Damascene interconnect, PSAB layer typically resides at an interface between the metal layer and a dielectric diffusion barrier layer. PSAB layers promote improved adhesion between a metal layer and an adjacent dielectric diffusion barrier layer. Further, PSAB layers can protect metal surfaces from inadvertent oxidation during fabrication process. A PSAB layer may be formed entirely within the top portion of a metal layer, by, for example, chemically converting metal surface to a thin layer of metal silicide. Thickness of PSAB layers, and, consequently resistance of interconnects can be controlled by partially passivating metal surface prior to formation of PSAB layer. Such passivation can be accomplished by controllably treating metal surface with a nitrogen-containing compound to convert metal to metal nitride.

20 Claims, 12 Drawing Sheets

U.S. PATENT DOCUMENTS

| | | | |
|---|---|---|---|
| 6,821,890 | B2 | 11/2004 | McGahay et al. |
| 6,855,645 | B2 | 2/2005 | Tang et al. |
| 6,869,873 | B2 | 3/2005 | Bradshaw et al. |
| 6,974,768 | B1 | 12/2005 | Kailasam |
| 7,060,619 | B2 | 6/2006 | Cowley et al. |
| 7,202,185 | B1 | 4/2007 | Hausmann et al. |
| 7,211,509 | B1 | 5/2007 | Gopinath et al. |
| 7,239,017 | B1 | 7/2007 | Yu et al. |
| 7,247,946 | B2 | 7/2007 | Bruley et al. |
| 7,250,679 | B2 | 7/2007 | Otsuka |
| 7,282,438 | B1 | 10/2007 | Yu et al. |
| 7,297,608 | B1 | 11/2007 | Papasouliotis et al. |
| 7,396,759 | B1 | 7/2008 | Van Schravendijk et al. |
| 7,402,532 | B2 | 7/2008 | Clevenger et al. |
| 7,420,275 | B1 | 9/2008 | Yu et al. |
| 7,452,743 | B2 | 11/2008 | Oliver et al. |
| 7,576,006 | B1 | 8/2009 | Yu et al. |
| 7,648,899 | B1 | 1/2010 | Banerji et al. |
| 7,704,873 | B1 | 4/2010 | Yu et al. |
| 7,727,880 | B1 | 6/2010 | Chattopadhyay et al. |
| 7,727,881 | B1 | 6/2010 | Chattopadhyay et al. |
| 7,799,671 | B1 | 9/2010 | Banerji et al. |
| 7,858,510 | B1 | 12/2010 | Banerji et al. |
| 8,021,486 | B1 * | 9/2011 | Yu et al. ........... 118/719 |
| 8,030,777 | B1 | 10/2011 | Van Schravendijk et al. |
| 2001/0006701 | A1 | 7/2001 | Kobayashi et al. |
| 2002/0066411 | A1 | 6/2002 | Chiang et al. |
| 2002/0155702 | A1 | 10/2002 | Aoki et al. |
| 2002/0173158 | A1 | 11/2002 | Jeng |
| 2003/0209738 | A1 | 11/2003 | Ohto et al. |
| 2004/0097075 | A1 | 5/2004 | Bradshaw et al. |
| 2004/0175921 | A1 | 9/2004 | Cowley et al. |
| 2004/0238963 | A1 | 12/2004 | Fujisawa |
| 2005/0048767 | A1 | 3/2005 | Matsumoto |
| 2005/0127511 | A1 | 6/2005 | Yang et al. |
| 2005/0282378 | A1 | 12/2005 | Fukunaga et al. |
| 2006/0046479 | A1 | 3/2006 | Rajagopalan et al. |
| 2006/0166448 | A1 | 7/2006 | Cohen |
| 2006/0286764 | A1 | 12/2006 | Zhang et al. |
| 2007/0035029 | A1 | 2/2007 | Caubet et al. |
| 2007/0037388 | A1 | 2/2007 | Hohage et al. |
| 2007/0059925 | A1 | 3/2007 | Choi et al. |
| 2007/0105377 | A1 | 5/2007 | Koos et al. |
| 2010/0308463 | A1 | 12/2010 | Yu et al. |

FOREIGN PATENT DOCUMENTS

| | | |
|---|---|---|
| EP | 2259303 | 12/2010 |
| JP | 56157037 | 12/1981 |
| JP | 09082696 A | 3/1997 |
| JP | 2000-252278 | 9/2000 |
| TW | 201117321 | 5/2011 |
| TW | 201138024 | 11/2011 |

OTHER PUBLICATIONS

U.S. Appl. No. 11/709,294, filed Feb. 20, 2007, Entitled: "Protective Self-Aligned Buffer Layers for Damascene Interconnects".

U.S. Appl. No. 11/710,652, filed Feb. 22, 2007, Entitled: "Improved Diffusion Barrier and Etch Stop Films".

Office Action dated Jun. 13, 2007, Novellus Systems, Inc., van Schravendijk et al., "Protection of CU Damascene Interconnects by Formation of a Self-Aligned Buffer Layer" U.S. Appl. No. 10/980,076, filed Nov. 3, 2004.

Renesas Technology Corp., Japan, "Reliability Improvement and its Mechanism for Cu Interconnects with Cu-Al Alloy Seeds", pp. 77 & 78 (ADMETA 2006).

IEEE 07CH37867 45th Annual International Reliability Physics Symposium, Phoenix, 2007, NEC Electronics Corporation, Japan "Analytical Study of Impurity Doping Effects on Electromigration of Cu Interconnects by Employing Comprehensive Scattering Model", pp. 117-121.

IEEE © 2004, Taiwan Semiconductor Manufacturing Company, Ltd., "High Performanc Cu interconnects capped with Full-Coverage ALD TaNx layer for Cu/Low-κ(κ~2.5) Metallization", pp. 72-74.

IEEE © 2005, NEC Corporation and NEC Electronics, Japan, A Robust 45 nm-node, Dual Damascene Interconnects with High Quality Cu/barrier Interface by a Novel Oxygen Absorption Process (4) four pages.

U.S. Office Action, mailed Nov. 28, 2007, for U.S. Appl. No. 10/980,076.

U.S. Office Action, mailed Aug. 21, 2008 for U.S. Appl. No. 11/888,323.

U.S. Office Action, mailed Apr. 2, 2009 for U.S. Appl. No. 12/074,108.

Notice of Allowance and Fee Due mailed Jun. 17, 2009 for U.S. Appl. No. 11/888,323 and Allowed Claims.

U.S. Office Action mailed Sep. 1, 2009 for U.S. Appl. No. 11/709,293.

U.S. Office Action mailed Sep. 4, 2009 for U.S. Appl. No. 11/709,294.

Novellus Systems, Inc., Banerji et al., "Interfacial Layers for Electromigration Resistance Improvement in Damascene Interconnect" U.S. Appl. No. 12/630,457, filed Dec. 3, 2009.

Notice of Allowance and Fee Due, mailed Sep. 4, 2009, for U.S. Appl. No. 12/074,108 and Allowed Claims.

U.S. Notice of Allowance and Allowed Claims mailed Jan. 29, 2010 for U.S. Appl. No. 11/709,293.

U.S. Notice of Allowance and Allowed Claims mailed Feb. 22, 2010 for U.S. Appl. No. 11/709,294.

Novellus Systems, Inc., Chattopadhyay et al., "Protective Self-Aligned Buffer Layers for Damascene Interconnects", U.S. Appl. No. 12/763,545, filed Apr. 20, 2010.

Novellus Systems, Inc. Yu et al., "Interfacial Capping Layers for Interconnects", U.S. Appl. No. 12/688,154, filed Jan. 15, 2010.

Novellus Sytstems, Inc., Banerji et al., "Interfacial Layers for Electromigration Resistance Improvement in Damaascene Interconnects", U.S. Appl. No. 12/689,803, filed Jan. 19, 2010.

Novellus Sytstems, Inc., Yu et al., "Protective Self-Aligned Buffer Layers for Damascene Interconnects", U.S. Appl. No. 12/693,645, filed Jan. 26, 2010.

U.S. Notice of Allowance and Allowed Claims, mailed Jun. 28, 2010, for U.S. Appl. No. 12/630,457 and Allowed Claims.

Quirk, "Semiconductor manufacturing technology", 2001, Prentice Hall, pp. 522-527.

U.S. Notice of Allowance and Allowed Claims dated Aug. 12, 2010 issued in U.S. Appl. No. 12/689,803.

U.S. Office Action dated Dec. 3, 2010 issued in U.S. Appl. No. 12/693,645.

U.S. Office Action dated Dec. 12, 2008 issued in U.S. Appl. No. 11/671,161.

U.S. Final Office Action dated Jun. 17, 2009 issued in U.S. Appl. No. 11/671,161.

U.S. Office Action dated Oct. 29, 2009 issued in U.S. Appl. No. 11/671,161.

U.S. Final Office Action dated Feb. 19, 2010 issued in U.S. Appl. No. 11/671,161.

U.S. Office Action dated Aug. 17, 2010 issued in U.S. Appl. No. 11/671,161.

U.S. Final Office Action dated Dec. 6, 2010 issued in U.S. Appl. No. 11/671,161.

U.S. Notice of Allowance and Allowed Claims dated May 31, 2011, issued in U.S. Appl. No. 11/671,161.

U.S. Notice of Allowance and Allowed Claims dated May 18, 2011 issued in U.S. Appl. No. 12/693,645.

U.S. Office Action dated Aug. 9, 2011 issued in U.S. Appl. No. 12/467,200.

U.S. Office Action dated Feb. 8, 2012 issued in U.S. Appl. No. 12/688,154.

Yu et al., U.S. Appl. No. 13/486,272, filed Jun. 1, 2012, entitled "Metal and Silicon Containing Capping Layers for Interconnects".

Chattopadhyay et al., U.S. Appl. No. 13/482,786, filed May 29, 2012, entitled "Selective Capping of Metal Interconnect Lines During air Gap Formation".

U.S. Notice of Allowance and allowed claims dated May 29, 2012 issued in U.S. Appl. No. 12/688,154.

* cited by examiner

PROTECTIVE SELF-ALIGNED BUFFER LAYERS FOR DAMASCENE INTERCONNECTS

CROSS-REFERENCE TO RELATED APPLICATIONS

This application is a division claiming priority from U.S. patent application Ser. No. 11/709,294 filed Feb. 20, 2007, titled "Protective Self-Aligned Buffer Layers for Damascene Interconnects", naming Chattopadhyay et al. as inventors, which is a continuation-in-part claiming priority under 35 USC 120 from U.S. patent application Ser. No. 10/980,076 filed Nov. 3, 2004, titled "Protection of Cu Damascene Interconnects by Formation of a Self-aligned Buffer Layer," naming van Schravendijk et al. as inventors, which are incorporated herein by reference in their entireties and for all purposes.

FIELD OF THE INVENTION

The present invention pertains to methods of forming layers of material on a partially fabricated integrated circuit. Specifically, the invention pertains to methods for forming protective self-aligned buffer (PSAB) layers for use in Damascene interconnects.

BACKGROUND OF THE INVENTION

Damascene processing is a method for forming metal lines on integrated circuits. It involves formation of inlaid metal lines in trenches and vias formed in a dielectric layer (inter metal dielectric). Damascene processing is often a preferred method because it requires fewer processing steps than other methods and offers a higher yield. It is also particularly well-suited to metals such as copper that cannot be readily patterned by plasma etching.

In a typical Damascene process flow, metal is deposited onto a patterned dielectric to fill the vias and trenches formed in the dielectric layer. The resulting metallization layer is typically formed either directly on a layer carrying active devices, or on a lower lying metallization layer. A thin layer of a dielectric diffusion barrier material, such as silicon carbide or silicon nitride, is deposited between adjacent metallization layers to prevent diffusion of metal into bulk layers of dielectric. In a typical integrated circuit (IC), several metallization layers are deposited on top of each other forming a stack, in which metal-filled vias and trenches serve as IC conducting paths. The conducting paths of one metallization layer are connected to the conducting paths of an underlying or overlying layer by a series of Damascene interconnects.

Fabrication of these interconnects presents several challenges, which become more and more significant as the dimensions of IC device features continue to shrink. Currently, at the 90 nm technology node and at more advanced nodes, there is a strong need for interconnect fabrication methods that can provide interconnects with improved lifetime and reliability.

SUMMARY OF THE INVENTION

To address these needs, IC devices having interconnects with protective self aligned buffer (PSAB) layers are provided. Methods of forming PSAB layers during IC device fabrication are also described herein. PSAB layers are layers of material that are selectively formed at the surface of metal layers of a partially fabricated semiconductor device. PSAB layers may be capable of improving several properties of Damascene interconnects. For example, a PSAB layer may promote improved adhesion between a metal layer and an adjacent dielectric diffusion barrier layer. Further, PSAB layers can protect metal surfaces from inadvertent oxidation during fabrication processes and can lead to a decrease in metal electromigration during end use of a semiconductor device. Methods of forming PSAB-containing interconnects having reduced stress migration parameters are also provided.

In some embodiments, a PSAB layer is formed entirely within the top portion of a metal layer, such that it is substantially at the same level as the plane of a dielectric field region adjacent to the metal layer. This can be accomplished by chemically transforming exposed metal atoms to a desired material. For example, Cu can react with $SiH_4$ to form a thin PSAB layer of $Cu_xSi_y$ within the top portion of metal layer. While PSAB layers generally increase resistance of interconnects, such resistance shift can be efficiently controlled. Specifically, thickness of PSAB layers, and, consequently, resistance of an interconnect can be controlled by partially passivating exposed metal surfaces, prior to formation of the PSAB layer. Such passivation can be accomplished by, for example, controllably reacting surface atoms with a nitrogen-containing compound (e.g., $NH_3$) to form a metal nitride. Such passivation depletes the amount of metal atoms (in a zero oxidation state) that are available for reaction to form the PSAB layer, and, consequently, controls the thickness of the PSAB layer and resistance of an interconnect.

Further, in some embodiments, resistance of interconnects is controlled by a "pinning" operation which serves to limit the diffusion of non-conductive species into the metal line. In some embodiments, "pinning" comprises chemically transforming the first-formed PSAB layer as well as transforming intermediates and by-products of a first PSAB forming reaction to form a thin layer of dielectric material, such as $Si_xN_y$ or $Si_xC_y$, at the interface between the metal layer and a layer of dielectric diffusion barrier material. Such layer is referred to as a "pinned PSAB layer". This dielectric material may or may not have Cu dissolved within it and therefore in some embodiments could have small amount of conductivity. In some embodiments, pinned PSAB layer includes some unmodified material of the first PSAB layer, Such as $Cu_xSi_y$, $Cu_xGe_y$, etc.

In some embodiments, PSAB layers have a graded composition, with concentration of PSAB material gradually decreasing as the distance from the interface with the diffusion barrier increases. Thus, according to some embodiments, PSAB layers may be viewed as layers of metal impregnated with a PSAB material (e.g., $Cu_xSi_y$, and/or $Si_xN_y$) at an interface with a dielectric diffusion barrier, where concentration of the PSAB material is gradually changing.

In one aspect, a method of forming a protective layer of material on or within an exposed metal surface of a partially fabricated semiconductor device is provided. For example, the method can be practiced on a substrate having a metal layer comprising a metal fill located in a Damascene region of the partially fabricated device. The substrate, in some embodiments, is received after a chemical mechanical polishing (CMP) operation and has a planarized surface. In a first operation of one embodiment of the provided method, the substrate having a pattern of metal layers in a layer of dielectric is contacted with a passivating reagent to partially passivate the metal surface. In one embodiment, a nitrogen containing reagent, e.g., $NH_3$, contacts the partially fabricated device and interacts with an exposed metal surface to form a metal nitride, e.g., $Cu_xN_y$, at the surface of the metal layer, thereby passivating metal surface to a subsequent PSAB-forming reaction. Other nitrogen containing compounds that may be used include $N_2H_4$, and amines. Preferably such compounds are capable of passivating the surface of the metal in the absence of plasma. Typically plasma is not used during passivation with $NH_3$, for example. After the metal surface has been partially passivated, the substrate is contacted with a second reactant, such that the second reactant reacts with unpassivated metal atoms of the metal layer and chemically transforms the top portion of the metal layer into a first PSAB layer. In some embodiments, the second reactant comprises a second reactant gas or vapor selected from the group consisting of $SiH_4$, $GeH_4$, $PH_3$, $B_2H_6$, $AsH_3$, $CH_4$, $C_xH_y$, $H_2S$, $H_2Se$, and $H_2Te$. The first PSAB layer may include, in certain embodiments, material selected from the group consisting of $Cu_xSi_y$, $Cu_xGe_y$, $Cu_xP_y$, $Cu_xB_y$, $Cu_xAs_y$, $Cu_xC_y$, $Cu_xS_y$, $Cu_xSe_y$, and $Cu_xTe_y$. Plasma is typically not used during this operation.

In some embodiments, the first PSAB layer resides entirely within the metal layer. The depth of the first PSAB layer is regulated by an amount of the passivated material (e.g., metal nitride) formed in the first operation, and can range, for example, between 10-1000 Å. The greater the amount of the passivated material formed at the metal surface, the less is the depth of the first PSAB layer. Thus, the thickness of the first PSAB layer, and, consequently, resistance of interconnect, is controlled via a partial passivation of exposed metal surface. In certain embodiments, PSAB layers having a thickness ranging between about 10-60 Å can be formed in a controlled fashion. Control can be achieved, in some embodiments, by regulating the contact time of the nitrogen containing passivating reagent with the substrate.

In some embodiments, the nitrogen containing passivating reagent selectively transforms exposed portions of the metal layer, without transforming other exposed materials of the semiconductor substrate, e.g., a dielectric layer.

Passivation and formation of the first PSAB layer can be performed in a variety of types of apparatus. For example, different types of CVD apparatus may be employed. In some embodiments, both operations are performed in the same apparatus, e.g., in a plasma enhanced chemical vapor deposition (PECVD) apparatus. In some embodiments, a multi-station apparatus is used to implement described methods. It is also possible to perform the PSAB process in an apparatus having multiple chambers.

In some embodiments, passivation and formation of a first PSAB layer is carried out in a PECVD apparatus, but plasma is not used during these two operations. Plasma is used, in some embodiments, during a pre-clean operation, which in some implementations of the method is performed prior to passivation of the metal surface. Pre-clean is typically performed using reducing gases, such as $H_2$ and $NH_3$ in a plasma, which may be generated in some embodiments using high frequency (HF) and low frequency (LF) radio frequency (RF) power sources. Pre-cleaning removes contaminants and metal oxide from the surface of the substrate and provides a clean metal surface for PSAB formation.

The pre-cleaning, passivation, and formation of the first PSAB layer can be carried out in one apparatus, without exposing the substrate to ambient atmosphere containing moisture and oxygen.

In some embodiments, passivation and formation of the first PSAB layer is carried out at a temperature range from about 20° C. to about 500° C., at a pressure range of about 10 mTorr-100 Torr, and using flow rates for a nitrogen-containing reactant and for the second reactant (e.g., $SiH_4$) of about 10 mTorr-100 Torr. In some embodiments, contact times of a nitrogen containing reagent and of a second reactant (e.g., $SiH_4$) with a substrate are within the range of 0.5-5000 seconds.

In some embodiments, the first formed PSAB layer may be further treated to form a so-called "pinned" PSAB layer. "Pinning" is often used to chemically transform intermediates and by-products generated during formation of the first PSAB layer to materials that do not readily diffuse into the depth of metal lines. Thus, pinning, controls interconnect resistance by limiting diffusion of non-conducting species into metal-filled vias and trenches. In some embodiments, pinning can also partially or completely chemically transform the material of the first PSAB layer. Certain pinning reagents, such as hydrocarbons, form pinned PSAB layers that result in improved stress migration performance of formed interconnects.

In one embodiment, pinning is performed by contacting the partially fabricated semiconductor device having a first PSAB layer (e.g., containing $Cu_xSi_y$) with a third reactant to form a pinned PSAB layer. In some embodiments, the third reactant (which is also referred to as a pinning reactant) comprises a gas or a vapor selected from the group consisting of $N_2$, $NH_3$, a hydrocarbon, a gas from the family of methyl-substituted silanes, a gas from the family of methyl-substituted amines and hexamethyldisilazane (HMDS). Mixtures of the above mentioned reactants may be also used in some embodiments. In some embodiments, pinning is plasma-assisted and is performed in a PECVD apparatus. In one embodiment pinning is performed using $NH_3$ in a plasma. In another embodiment pinning is performed using a mixture of a hydrocarbon and $NH_3$ (or $N_2$) in a plasma. In yet another embodiment, a hydrocarbon plasma can be used in the absence of $N_2$ or $NH_3$. Inclusion of a hydrocarbon as a pinning reagent was found to be associated with improvement in stress migration characteristics of interconnects. Hydrocarbons, as used herein, are defined as compounds with $C_xH_y$ composition, which may be optionally substituted with heteroatoms, such as S, N, P, etc. Hydrocarbons, as used herein include acyclic and cyclic alkanes, alkenes, alkynes, as well as amines, mercaptans, thioethers and organic phosphines. Examples of hydrocarbons that do not include heteroatoms and that can be used as pinning reactants are methane, ethane, ethylene, acetylene, propane, propene, propyne, cyclopropane, cyclobutane, butanes, butenes, butynes, and benzene.

Note that in some embodiments, identical reagent is used during passivation and pinning operations, e.g., $NH_3$. The pinned PSAB layer, in some embodiments, includes materials, such as $Si_xN_y$ and/or $Si_xC_y$. In other embodiments, different materials may be formed upon pinning, depending on the chemistry of the first PSAB layer and on the nature of intermediates and by-products formed in the first PSAB-forming reaction.

In certain embodiments, the pinned PSAB layer has a thickness ranging from about 10 Å to 60 Å. The devices having pinned PSAB layers can have resistance shifts of less than 3%, and, in some cases, less than 1%.

The stress migration parameters of interconnects can be further improved by including a hydrogen plasma treatment into the PSAB process flow. Hydrogen plasma treatment can be performed concurrently with pinning, e.g., using a mixture of $NH_3$ and/or $N_2$ with $H_2$ in a plasma during pinning. In other embodiments, hydrogen plasma treatment can be implemented as a separate post-treatment operation performed after the PSAB layer has been pinned.

After the PSAB layer has been formed, a blanket dielectric diffusion barrier layer is typically deposited. Dielectric diffusion barrier layers may include silicon nitride and silicon carbide based materials, such as high carbon content silicon carbide, oxygen doped silicon carbide, nitrogen doped silicon carbide, boron doped silicon carbide and the like. In some embodiments deposition of a dielectric diffusion barrier layer is performed at a temperature that is higher than the temperature used in the PSAB formation (including passivation and pinning operations). For example, in some embodiments, PSAB formation is implemented at a temperature under 350° C., e.g., at about 250-300° C., while diffusion barrier deposition is performed at a temperature of at least 350° C., e.g., 375-450° C.

In another aspect, a method of forming a PSAB layer of material includes contacting the partially fabricated semiconductor device with a PSAB forming reactant to form a first PSAB layer, followed by a pinning operation, which comprises contacting the first PSAB layer with a pinning process gas in a plasma and contacting the device with $H_2$ in a plasma. $H_2$ plasma treatment can be performed concurrently with the pinning operation or subsequent to pinning, as a post-treatment step. Use of $H_2$ plasma treatment as a pinning reactant reduces stress migration in the formed interconnects.

In another aspect a method of forming a PSAB layer of material includes contacting the partially fabricated semiconductor device with a PSAB forming reactant to form a first PSAB layer, followed by a pinning operation, which comprises contacting the first PSAB layer with a process gas comprising a hydrocarbon to form a pinned PSAB layer. Use of hydrocarbon as a pinning reactant reduces stress migration in the formed interconnects.

In another aspect, a semiconductor device having at least one interconnect is provided. The interconnect comprises an interface between a metal layer and a dielectric diffusion barrier layer and a PSAB layer residing entirely within the metal layer adjacent the dielectric diffusion barrier. In one embodiment, this PSAB layer comprises $Si_xN_y$ and/or $Cu_x$-$Si_y$. In other embodiments it may comprise a material selected from the group consisting of $Cu_xGe_y$, $Cu_xP_y$, $Cu_xB_y$, $Cu_xAs_y$, $Cu_xC_y$, $Cu_xS_y$, $Cu_xSe_y$, $Cu_xTe_y$ and mixtures thereof.

In yet another aspect, an apparatus for forming a protective self aligned buffer layer within a metal layer in a partially fabricated semiconductor device is provided. The apparatus includes a process chamber having an inlet for introduction of reactants; a wafer support for holding the wafer in position during formation of the protective self aligned buffer layer; and a controller comprising program instructions for: (i) contacting the partially fabricated semiconductor device with a nitrogen containing reactant for a period of time, wherein the nitrogen containing reactant interacts with the exposed metal surface of a metal layer, to form a metal nitride at the surface of said metal layer, thereby passivating said metal surface; and (ii) subsequently contacting the partially fabricated semiconductor device with a second reactant, such that the second reactant reacts with unpassivated metal atoms of the metal layer and chemically transforms the top portion of the metal layer into a first protective self-aligned buffer layer, wherein said buffer layer resides entirely within said metal layer.

These and other features and advantages of the present invention will be described in more detail below with reference to the associated drawings.

DETAILED DESCRIPTION OF PREFERRED EMBODIMENTS

Introduction and Overview

Formation of PSAB layers in interconnects will be illustrated in the context of a copper dual Damascene processing. It is understood, that methods disclosed herein can be used in other processing methods, including single Damascene processing, and can be applied to a variety of metals beyond copper. For example, these methods can be applied to gold and silver-containing interconnects.

Figure 1A:
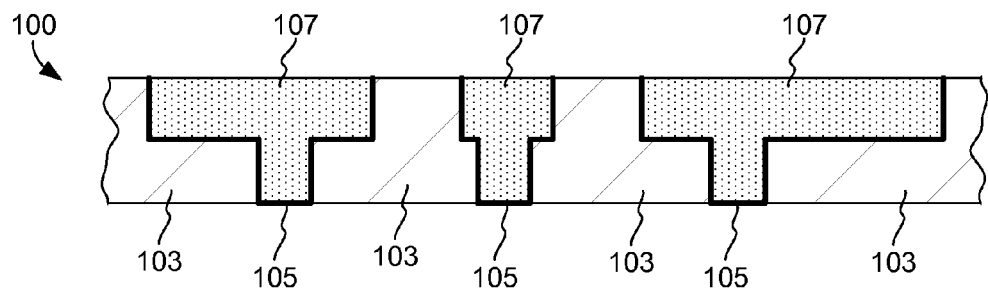
FIGS. 1A-1E show cross sectional depictions of device structures created during a copper dual Damascene fabrication process.

Presented in FIGS. 1A-1D, is a cross sectional depiction of device structures created on a semiconductor substrate at various stages of a dual Damascene fabrication process. A cross sectional depiction of a completed structure created by the dual Damascene process is shown in FIG. 1E. "Semiconductor substrate" as used in this application is not limited to the semiconductor portions of an IC device, but is broadly defined as a semiconductor-containing substrate. Referring to FIG. 1A, an example of a partially fabricated IC structure, 100, used for dual Damascene fabrication is illustrated. Structure 100, as illustrated in FIGS. 1A-1D, is part of a semiconductor substrate, and, in some embodiments, may directly reside on a layer containing active devices, such as transistors. In other embodiments, it may directly reside on a metallization layer or on other layers that incorporate conductive materials, e.g., layers containing memory capacitors.

A layer 103 illustrated in FIG. 1A is a layer of inter-metal dielectric, which may be silicon dioxide but is more typically a low-k dielectric material. In order to minimize the dielectric constant of the inter-metal dielectric stack, materials with a k value of less than about 3.5, preferably less than about 3.0 and often as low as about 2.8 are employed as inter layer dielectrics. These materials include but are not limited to fluorine or carbon doped silicon dioxide, organic-containing low-k materials and porous doped silicon dioxide materials known to those of skill in the art. Layer 103 is etched with line paths (trenches and vias) in which a partially conductive metal diffusion barrier 105 is deposited, followed by inlaying with copper conductive routes 107. Because copper or other mobile conductive material provides the conductive paths of the semiconductor substrate, the underlying silicon devices and dielectric layers proximate to metal lines must be protected from metal ions (e.g., $Cu^2$) that might otherwise diffuse or drift into the silicon or inter-layer dielectric and result in degradation of their properties. Several types of metal diffusion barriers are used in order to protect the dielectric layers of the IC device. These types may be divided into partially conductive metal-containing layers such as 105 and dielectric barrier layers which will be described in further detail with reference to FIG. 1B. Suitable materials for partially conductive diffusion barrier 105 include materials, such as tantalum, tantalum nitride, titanium, titanium nitride and the like. These are typically deposited onto a dielectric layer having vias and trenches by a PVD method.

Copper conductive routes 107 can be formed by a number of techniques, including PVD, electroplating, electroless deposition, CVD, etc. In some implementations, a preferred method of forming a copper fill includes depositing a thin seed layer of copper by PVD and subsequently depositing bulk copper fill by electroplating. Since copper is typically deposited with overburden residing in the field region, a chemical mechanical polishing (CMP) operation is needed to remove the overburden and to obtain a planarized structure 100.

Figure 1B:
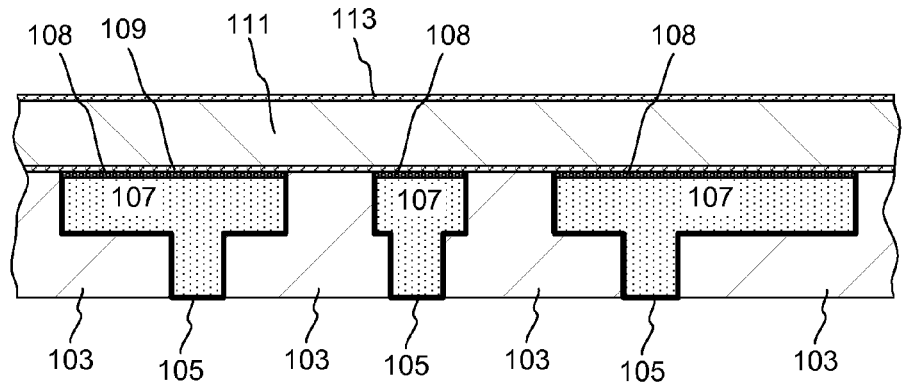

Next, referring to FIG. 1B, after the structure 100 has been completed, the surface of the substrate 100 is pre-cleaned to remove contaminants and metal oxide. After the pre-clean, PSAB layers 108 are formed within the top portions of metal lines 107. Composition of PSAB layers and methods of forming them will be described in the following sections in detail.

As depicted in FIG. 1B, a diffusion barrier film 109 is deposited on top of the PSAB layers 108 and on top of a dielectric layer 103 to encapsulate conductive routes 107. The dielectric diffusion barrier film may also serve as an etch stop during subsequent Damascene processing. In contrast to partially conductive barrier 105, film 109 should be non-conductive and should preferably have a low dielectric constant. Preferably materials with a dielectric constant of less than about 6, e.g., with a dielectric constant of lower than about 4 are used for a diffusion barrier film 109. Film 109 should also effectively prevent diffusion of metal into the dielectric layer and should provide etch selectivity when used as an etch stop. Conventionally, silicon nitride, and nitrogen-doped silicon carbide (NDC) were used for this application. Currently, materials with lower dielectric constants than silicon nitride are often used for this application. These materials include carbon-rich silicon carbide materials, such as those described in commonly assigned U.S. patent application Ser. No. 10/869,474 by Yu et al., filed on Jun. 15, 2004; boron-doped silicon carbide materials described in U.S. patent application Ser. No. 10/915,117 by Yu et al., filed on Aug. 9, 2004 and in U.S. patent application Ser. No. 11/373,847 by Yu et al. filed on Mar. 8, 2006; and oxygen-doped silicon carbide materials, e.g., described in U.S. Pat. No. 6,855,645 by Tang et al. issued on Feb. 15, 2005. Further, bi-layer and tri-layer configurations can be employed for the diffusion barrier 109. All patent applications that were mentioned in this paragraph are hereby incorporated by reference for all purposes.

The diffusion barrier film can be deposited on a semiconductor substrate by a variety of CVD-type methods. For example, plasma enhanced chemical vapor deposition (PECVD) may be used. In some embodiments, PECVD having a low frequency plasma component, provided by low frequency radio-frequency (LF RF) power source, is used for diffusion barrier deposition.

Referring again to FIG. 1B, a first dielectric layer, 111, of a dual Damascene dielectric structure is deposited on a diffusion barrier 109. This is followed by deposition of an etch stop film 113 by a PECVD method on the first dielectric layer 111. The dielectric layer 111 is typically composed of low-k dielectric materials such as those listed for a dielectric layer 103. Note that layers 111 and 103 need not necessarily have identical composition. Similarly, etch stop layer 113 may or may not have an identical composition to layer 109.

Figure 1C:
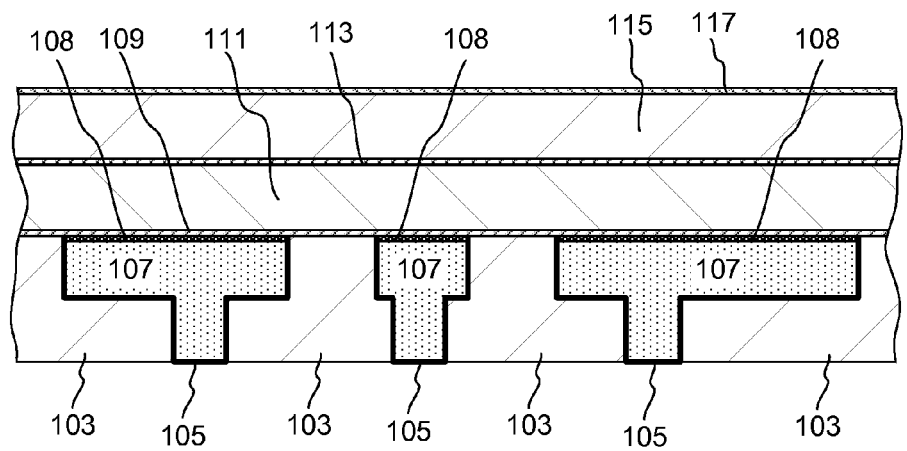

The process follows, as depicted in FIG. 1C, where a second dielectric layer 115 of the dual Damascene dielectric structure is deposited in a similar manner to the first dielectric layer 111, onto an etch-stop film 113. Deposition of an anti-reflective layer (not shown) and a CMP stop film 117 follows. Second dielectric layer 115 typically contains a low-k dielectric material such as those described above for layers 103 and 111. A CMP stop film 117 serves to protect the delicate dielectric material of inter-metal dielectric (IMD) layer 115 during subsequent CMP operations. Typically, a CMP stop layer is subject to similar integration requirements as a diffusion barrier and etch stop films 109 and 113, and can similarly be composed of materials described for layer 109.

Figure 1D:
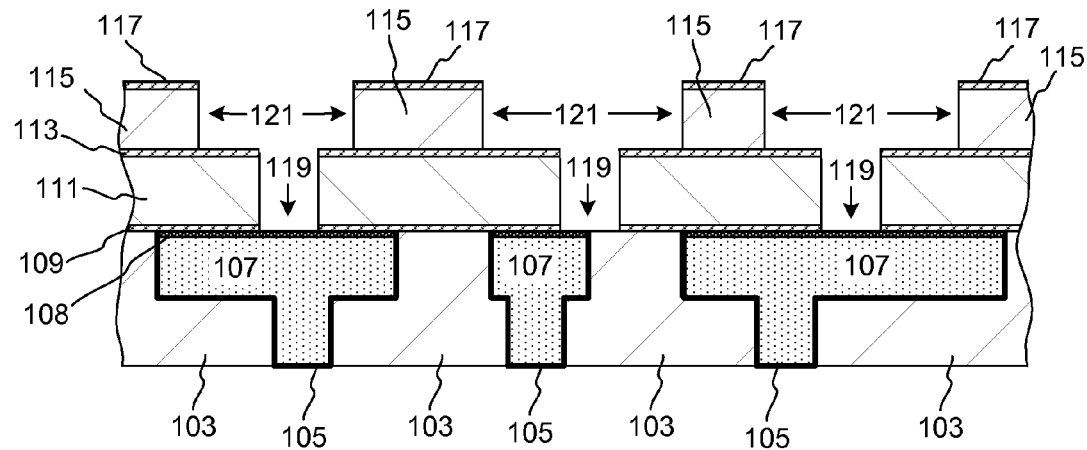
Figure 1E:
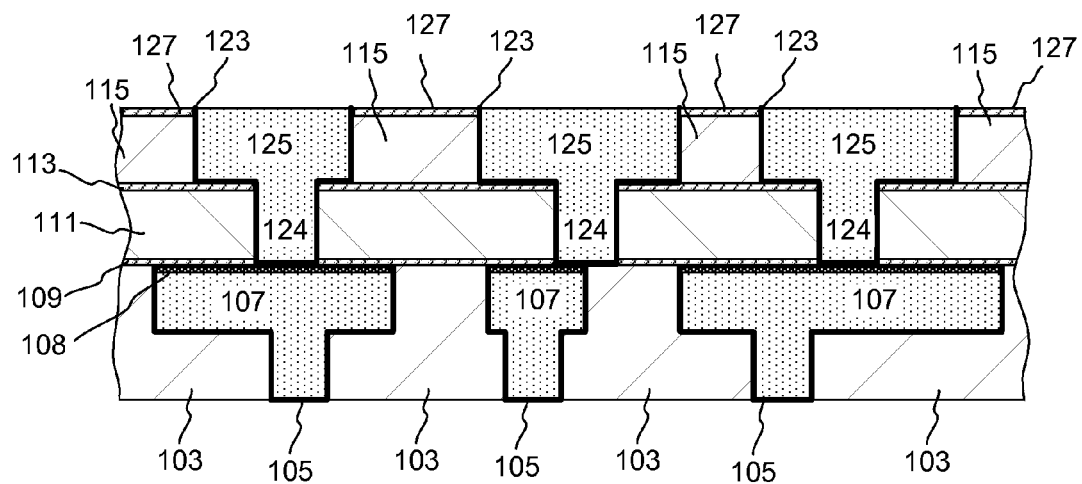

The dual Damascene process continues, as depicted in FIGS. 1D-1E, with etching of vias 119 and trenches 121 in the first and second dielectric layers. Standard lithography techniques are used to etch a pattern illustrated in FIG. 1D. A trench-first or a via-first methods well known by those of skill in the art may be employed.

Next, as depicted in FIG. 1E, these newly formed vias and trenches are, as described above, coated with a metal diffusion barrier 123, which may contain barrier materials, such as tantalum, tantalum nitride or other materials that effectively block diffusion of copper atoms into the dielectric layers.

After the diffusion barrier 123 has been deposited, a seed layer of copper is applied (typically by a PVD process) to enable subsequent electrofilling of the features with copper inlay. The copper layer is deposited by electrofill and excess of metal deposited in the field is removed in a CMP operation, performed such that CMP stops at the CMP stop film 117. FIG. 1E shows the completed dual Damascene process, in which copper conductive routes 124 and 125 are inlayed (seed layer not depicted) into the via and trench surfaces over barrier 123. A PSAB layer, analogous to a PSAB layer 108 can be the formed within the top portion of the metal fill 125, and a next metallization layer may be deposited on top of the device structure shown in FIG. 1E, if needed.

FIG. 1E depicts three Damascene interconnects, in which metal layer 107 is connected with metal layer 124 of an overlying metallization layer. The role of the PSAB layer 108 in these interconnects will be presently described.

The PSAB layer 108 serves as a protective buffer between the metal layer 107 and a dielectric diffusion barrier layer 109. First, the PSAB layer protects the metal layer 107 from inadvertent oxidation. When no PSAB layer is formed, copper surface can be oxidized to copper oxide during inadvertent exposure to oxygen or moisture in the course of device fabrication or during end use of the device. Formation of metal oxide is typically highly undesirable since it increases resistance of interconnects, and, further, commonly leads to formation of voids in the interconnect structure. Formation of voids in the copper conductor is detrimental to the IC device and should be avoided when possible. While dielectric diffusion barriers, such as 109, encapsulate the metal layers and may protect them to some extent from moisture and/or oxygen during end use, it should be noted that not all diffusion barrier materials are sufficiently hermetic to provide such protection. Further, exposure of metal layer to atmospheric moisture and oxygen may occur during fabrication of an IC device. In some implementations, Damascene processing may require operations that involve opening of metal layer to an ambient environment containing moisture and oxygen. For example, when no PSAB layer is present, metal layer 107 may be exposed to atmosphere after the vias and trenches are cut in a dielectric as shown in FIG. 1D.

Next, in some embodiments, PSAB layers can diminish electromigration at the interface between copper lines, and dielectric diffusion barrier. It has been found that this interface is the most likely point of failure during line current stress. Whereas the electromigration resistance of copper is high enough to sustain the wear-out in normally designed conductor lines, defect-induced electromigration failures have been observed at the interface between the copper and dielectric barrier layer. For instance, wherein copper oxides or hydroxides have been undesirably formed at such interfaces, voids will be formed in the copper layer, which adversely affect electromigration characteristics of such copper interconnects. Understandably, current density in these regions is considerably high during actual use, thereby causing defect-induced electromigration failure of such interconnects. PSAB layers protect metal layers from formation of defects, and thereby improve electromigration properties of interconnects.

Further, PSAB layers can provide improved adhesion between metal layers and diffusion barrier layers. Adhesion of metal to a barrier layer is an important characteristic of a copper interconnect. Poor adhesion may result in insufficient hermeticity of diffusion barrier layer and can lead to delamination of the diffusion barrier layer from an underlying metallization layer. Ultimately, such delamination may lead to failure of an interconnect. Generally, as dielectric constant of diffusion barrier material is decreasing, its adhesion to an underlying metal layer becomes weaker. This is especially true for diffusion barrier materials having high content of organic residues, such as alkyl groups, carbon-carbon bonds, etc., which generally hinder adherence to metal layers. Further, referring to barrier film stress characteristics, many barrier materials having low dielectric constant, form films that are not sufficiently compressive to effect good adhesion to metal layers. With these challenges in mind, it is often desirable to use PSAB layers to strengthen adhesion between metal layers and diffusion barrier layers with low dielectric constant. In some embodiments, it may be particularly advantageous to use PSAB layers adjacent diffusion barrier layers with a dielectric constant less than about 4.0, e.g., about 3.5. In other embodiments, PSAB layers may be used adjacent dielectric barrier layers with higher dielectric constant.

In a preferred embodiment, PSAB layers are formed selectively at the exposed surface of metal layers, such that other exposed materials on the substrate surface are not affected. Typically, the PSAB layer is formed by chemical modification of the top portion of the metal layer. Advantageously, such chemical modification selectively occurs only at the metal surface, without substantially modifying exposed surface of an adjacent layer of dielectric.

Figure 2A:
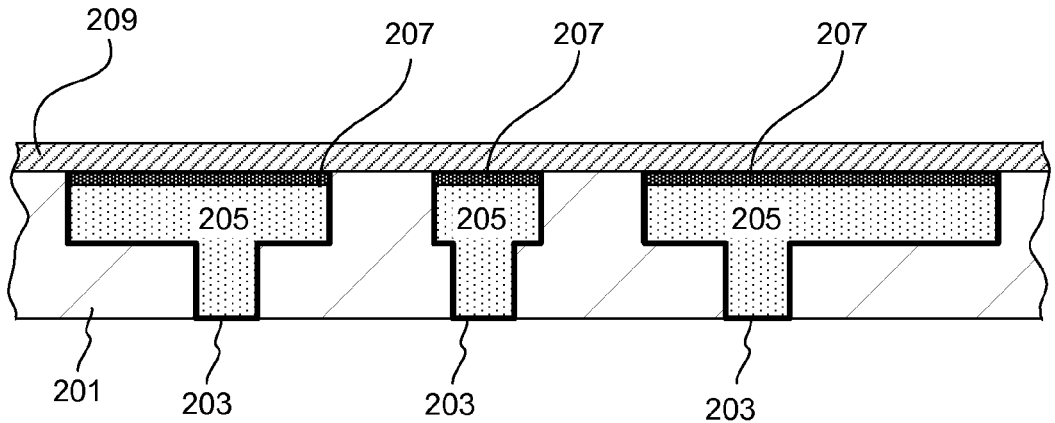
FIGS. 2A-2B show cross sectional depictions of partially fabricated device structures illustrating PSAB layers.

In some embodiments, a PSAB layer is formed entirely within the metal layer, such that the PSAB layer is formed to substantially the same level as the level of inter-layer dielectric adjacent the metal layer. This embodiment is illustrated in FIG. 2A, which presents a cross-sectional depiction of a partially fabricated semiconductor device. In this device, vias and trenches formed in an inter-layer dielectric 201, are lined with diffusion barrier material 203 and are filled with metal 205. The top portion of metal is selectively converted to a PSAB layer 207, such that the PSAB layer 207 is substantially at the same level as the layer 201. Thus, layer 207 does not extend vertically higher than the level of surrounding dielectric 201. This can be accomplished, by impregnating metal layer with PSAB material through chemical transformation of metal atoms. In some embodiments, no substantial deposition of material on top of the metal layer occurs during PSAB layer formation. In other embodiments, some material can be deposited or adsorbed on the surface of the metal layer, and later be consumed through diffusion into the metal layer and/or subsequent chemical reaction with metal atoms. Thus, in some embodiments, PSAB layer does not extend higher than 10 Å, preferably not higher than 5 Å above the level of dielectric 201 or the level of metal layer 205 prior to PSAB formation. After the PSAB layer has been formed, a blanket layer of dielectric diffusion barrier 209 is deposited over the substrate surface.

Yet in other embodiments, PSAB layer may extend higher than the layer of adjacent inter-layer dielectric. This can occur when in addition to chemical conversion of metal surface, a substantial amount of deposition onto the metal surface occurs during formation of the PSAB layer. These embodiments are illustrated by FIG. 2B, which shows a cross sectional depiction of a device, in which a PSAB layer 207 is higher than the level of dielectric 201 or the level of metal in metal line 205 prior to formation of the PSAB layer.

Figure 2B:
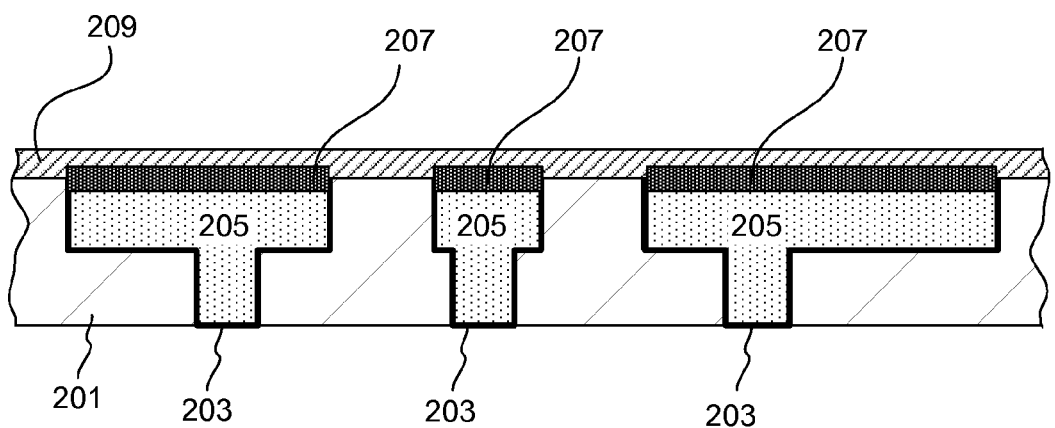

In both embodiments illustrated in FIG. 2A and FIG. 2B, PSAB layer 207 may have a multi-layer structure. Layers 207 may have two or more sublayers (not shown) which may have a distinct or gradually changing composition. For example layer 207, may have a bottom sublayer predominantly composed of $Cu_xSi_y$, and a top sublayer predominantly composed of $Si_xN_y$. In some embodiments, concentration of $Si_xN_y$ is gradually decreasing as the distance from the dielectric diffusion barrier is increasing. Such sublayers may be formed by transforming the top portion of the first-formed PSAB layer. For example, the top portion of PSAB layer may be modified by a transformation, effected by chemical treatment, plasma treatment, thermal treatment or some combination of these treatments.

In some embodiments, the first-formed PSAB layer (containing, e.g., $Cu_xSi_y$) is entirely transformed to a modified PSAB layer, without forming sublayers of material. A particular chemistry and amount of such modification is tailored to a particular application for a PSAB layer. In some embodiments, chemical modification of the first-formed PSAB layer may be necessary to control the thickness of PSAB layer. Further, in some embodiments, it may be advantageous to transform the first-formed PSAB layer or its top portion to a material that provides optimal adhesion with a dielectric diffusion barrier. Some of such materials include silicon nitride, silicon carbide, hydrogen-doped carbon, and their various doped modifications.

It should be noted that in certain embodiments, the PSAB layer has a graded composition. The PSAB layer may be viewed as an alloy of copper metal with PSAB material, or as a layer of copper impregnated with PSAB material at an interface with a dielectric diffusion barrier layer. The concentration of elemental copper in these embodiments is gradually decreasing towards the interface with the diffusion barrier layer, while concentration of PSAB material (often dielectric) is increasing. Such structure is particularly advantageous for improvement of adhesion between metal and dielectric layers, as gradual change in material properties leads to good binding between the two layers. While in some embodiments, PSAB layers are graded, in other embodiments PSAB layers may be distinct rather than blended into the underlying metal layers, and may have an abrupt boundary with the metal layer.

While PSAB layers provide numerous advantages to interconnect structure and performance, controlled formation of these layers presents several challenges. PSAB layers typically contain materials having low conductivity, and, therefore, PSAB presence increases resistance of interconnects.

Since such increase in resistance is undesirable, it is important to control thickness of PSAB layers, so that it does not exceed the thickness that is necessary for a particular application. Inadvertent formation of unnecessarily thick PSAB layers may increase interconnect resistance to levels that may not be acceptable in the industry. The challenges of preparing thin PSAB layers become more pronounced as the dimensions of features in IC devices continue to decrease. It is, for example, difficult to control PSAB layer thickness, and hence, interconnect resistance in metal lines that are only about 1000 Å deep. Methods of forming controlled amounts of PSAB materials are provided herein. These methods can be applied to IC substrates having a wide range of feature sizes, but may find particular use for IC device fabrication at 90 nm technology node and at more advanced nodes. For example, these methods may be particularly useful for fabricating devices, in which thickness of a single metallization layer does not exceed 1000 Å

Methods of Forming PSAB Layers

Thickness of PSAB layers and, consequently, resistance of interconnects can be controlled by modulating several parameters of the PSAB formation process. For example, amount of first formed PSAB material can be controlled by modulating the conditions of reaction that transforms metal atoms into a first PSAB material, e.g., temperature, reactant flow rate, reactant contact time etc. Further, thickness of PSAB layer can be controlled by limiting the diffusion of non-conductive materials generated during PSAB layer formation down the metal line. This can be accomplished by modifying the first-formed PSAB layer in a special "pinning" operation. Finally, it was unexpectedly discovered that it is possible to partially passivate the metal surface prior to PSAB layer formation, and thus limit the amount of first-formed PSAB material on the surface of the metal.

In some embodiments, a passivating reagent, e.g., $NH_3$ converts a certain fraction of metal atoms on an exposed surface of a metal layer to a passivated material. For example, treating the metal surface with a nitrogen-containing reagent, can convert elemental metal to metal nitride, thereby depleting the amount of metal atoms that are available for formation of a PSAB layer, and therefore essentially, passivating the metal surface towards the PSAB-forming reaction. In different embodiments passivation may be accomplished by different mechanisms. For example, in some embodiments, the passivating reagent may chemically transform a fraction of metal layer surface. In other embodiments, the passivating reagent may be adsorbed on a surface of metal layer, thereby decreasing the fraction of exposed metal atoms. Yet in other embodiments passivation may involve formation of a passivated layer (e.g., through chemical transformation or adsorption) that blocks the diffusion of PSAB material down the metal line.

Without being bound by a particular mechanism or theory of operation, it is herein provided that treatment of a partially fabricated IC device with certain passivating reagents prior to formation of the PSAB layer opens a possibility for controlling the thickness of PSAB layers. The greater the amount of passivated material formed at the metal surface, the smaller is the amount of subsequently formed PSAB material and, consequently, the smaller is the thickness of PSAB layer, and resistance of an interconnect The degree of passivation can be controlled by modulating the conditions of passivation process, such as the nature of passivating reagent, the temperature during passivation, the flow rate of the passivating reagent and its contact time with the metal surface. Passivation operation is performed, in some embodiments, preferably without igniting plasma.

Figure 3A:
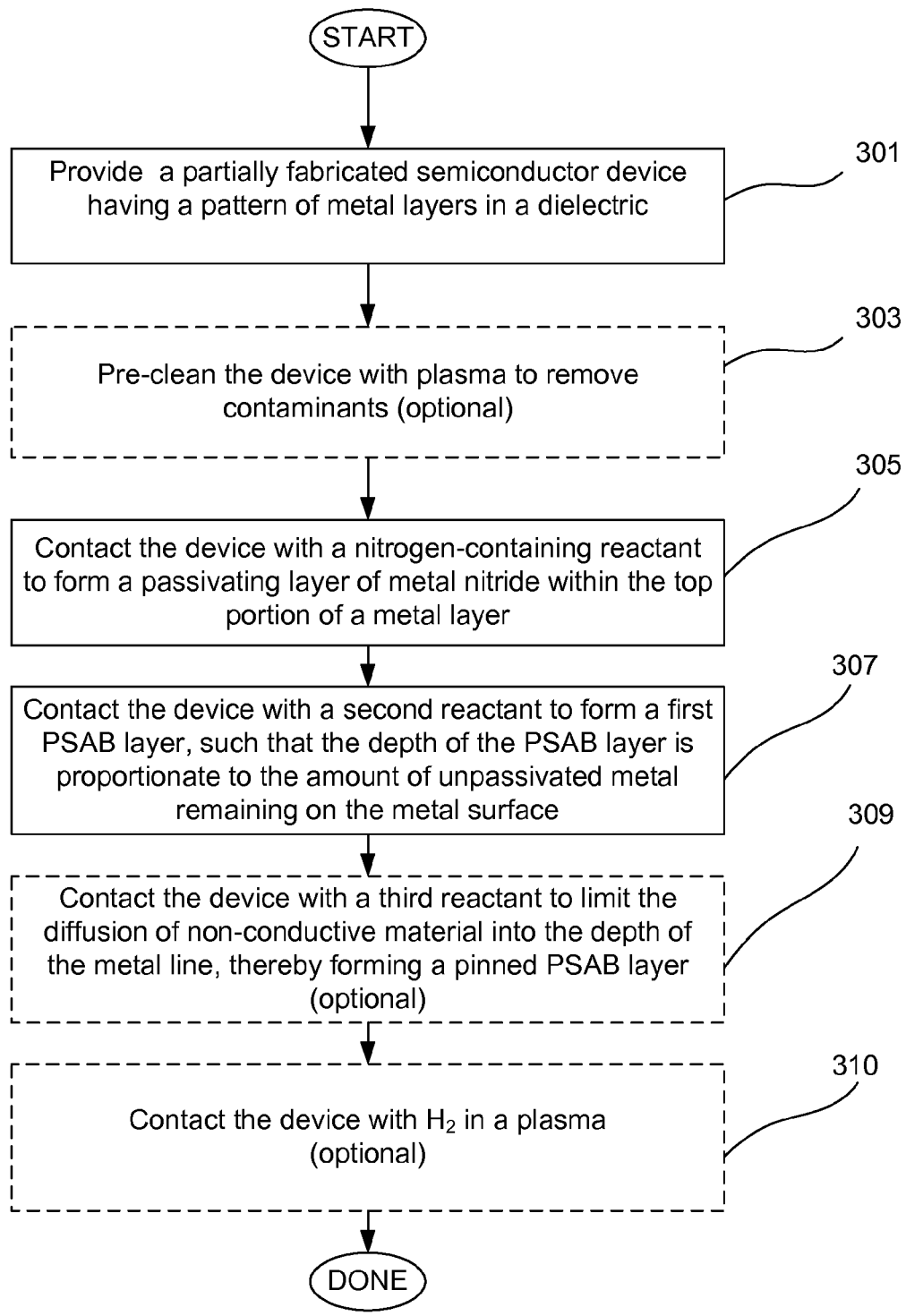
FIGS. 3A-3C present example process flow diagrams of a PSAB-forming process according to some embodiments.

Fabrication of interconnects using a process that includes partial passivation of the metal surface prior to formation of PSAB layer, may result in products that have a resistance shift of less than 3% and, in some cases less than 1%. For example, resistance shift of less than about 1% has been observed for devices at a 90 nm node, and resistance shift of less than about 3% has been observed for devices at a more advanced 65 nm node. Resistance shift is a difference between resistance of analogous interconnects with and without a PSAB layer measured at identical conditions. The process of forming interconnects with controlled resistance is illustrated by the process flow diagrams presented in FIGS. 3A-3C, and by cross-sectional views of device structures presented in FIGS. 4A-E. Referring to FIG. 3A, the process starts by providing a partially fabricated semiconductor device having a pattern of exposed metal layers in a dielectric, as shown in process block 301. The substrate is provided after the vias and trenches have been filled with metal and excess metal has been removed by CMP. Examples of such substrate are illustrated in FIG. 1A and in FIG. 4A. In FIG. 4A, a via and a trench formed in an inter-layer dielectric 401 are lined with a diffusion barrier 403, and are filled with a metal fill 405. The substrate is planarized by CMP prior to formation of the PSAB layer.

In some embodiments, the entire process shown in FIG. 3A is performed in a vacuum environment, without breaking the vacuum or exposing the partially fabricated device to an ambient atmosphere during or between the operations shown in FIG. 3A. In some embodiments, the entire process depicted in FIG. 3 is performed in one apparatus. Further, in some embodiments, the entire process depicted in FIG. 3A can be performed at one station of a multi-station apparatus. In some embodiments, $H_2$ plasma post-treatment shown in process block 310 is performed at a different station than operations 301-309, because, a different temperature may be required in order to optimize the impact of the $H_2$ post treatment process. Generally, the process shown in FIG. 3A can be performed at a temperature ranging from about 20° C. to 500° C., and at a pressure ranging from about 10 mTorr to about 100 Torr. The flow rates of reactants in the process can range from about 0.001 sccm to about 10000 sccm (per process chamber housing four 300 mm wafers), and reactant contact times can range from about 0.5 to about 50000 seconds, e.g. from about 0.5 to about 5000 seconds.

PSAB layer can be formed in any apparatus that provides mechanisms for reagent flow and a process chamber that can effectively isolate the fabricated device from moisture and oxygen of ambient environment. Preferably the apparatus should be capable of providing vacuum environment and a temperature that is necessary to perform the PSAB-forming reaction. For example, various types of CVD tools can be used for PSAB layer formation. In some embodiments, the PSAB-forming process may include operations that require plasma treatment, or plasma-enhanced reactions. Therefore, in some embodiments it is preferable to use PECVD tools, such as SEQUEL™ and VECTOR™ PECVD tools available from Novellus Systems, Inc. (San Jose, Calif.). Further, in some embodiments, a dual frequency PECVD apparatus that has high frequency (HF) and low frequency (LF) radio frequency (RF) plasma sources, is preferred. Low frequency RF power refers to RF power having a frequency between 100 kHz and 2 MHz. A typical frequency range for LF plasma source is between about 100 kHz to 500 kHz, e.g., 400 kHz frequency may be used. High frequency power refers to RF power with a frequency greater than 2 MHz. Typically HF RF frequency lies in the range of between about 2 MHz-30 MHz. A commonly used HF RF values include 13.56 MHz and 27 MHz. In some embodiments LF power ranging from about 0

W/cm² to 1.0 W/cm², and HF power ranging from 0.1-1.5 W/cm² can be used in plasma assisted operations, such as during pre-clean, pinning and H₂ post-treatment. In some embodiments a single frequency process is used in plasma-assisted operations.

Referring again to FIG. 3A, the substrate is provided to a process chamber and is optionally pre-cleaned as shown by the process block 303. Pre-cleaning operation removes contaminants from the surface of the wafer. In particular, pre-cleaning can remove metal oxide from the metal surface, thereby exposing metal atoms for subsequent reactions. It is desirable to perform pre-cleaning after a CMP operation or any exposure to moisture and oxygen, since CMP can leave a significant amount of contaminants on a wafer surface. Pre-clean operation can be accomplished by, for example, exposing the surface of a substrate to a plasma containing a reducing gas, such as $NH_3$ or $H_2$. In some embodiments pre-clean with $H_2$ plasma has provided devices with particularly improved characteristics. The process gas during pre-clean can also include a carrier gas, such as $N_2$, He, Ar, etc. In one example, pre-clean is performed in a PECVD chamber at a temperature of about 200-400° C., pressure of about 1.5-4 Torr and an $H_2$ flow rate of about 4000-10000 sccm. The plasma, which may contain an HF and an LF component is ignited and is sustained at a total power of 200-1000 W per one 300 mm wafer. In some embodiments, it is preferable to use HF power at 0.1-1.5 W/cm² and LF power at 0-0.8 W/cm² during the pre-clean operation. In another example, $NH_3$ is used instead of $H_2$ as a reducing gas, and is flowed into the process chamber at a flow rate ranging from about 6000 to 8000 sccm. An $N_2$ carrier gas is flowed into the chamber at a flow rate of about 2000-4000 sccm. The pre-cleaning treatment can last several seconds, e.g., between about 6-20 seconds.

Figure 4A:
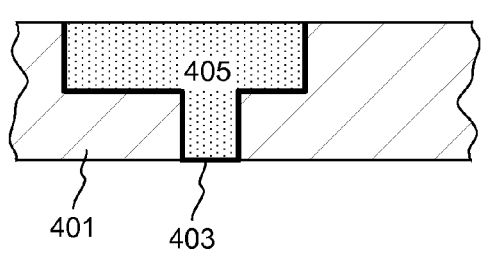
FIGS. 4A-4E show cross sectional depictions of device structures created during formation of a PSAB layer, according to some embodiments.
Figure 4B:
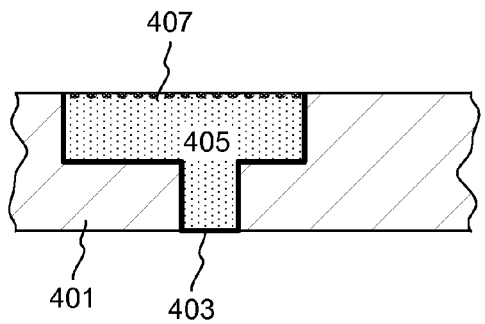

After the contaminants and metal oxides are removed from the surface of the substrate, the substrate is contacted with a passivating reagent. In some embodiments, the passivating reagent is a nitrogen-containing reagent that is capable of forming metal nitride, e.g., $Cu_xN_y$ at the surface of the metal layer, as shown in the process block 305. In a particular embodiment, the nitrogen-containing reagent is $NH_3$. Generally, a variety of nitrogen-containing compounds can be used. These include hydrazine ($N_2H_2$) and amines (e.g., methylamine, ethylamine, diethylamine, etc.). In some embodiments halogens or halogen-containing compounds may be used as passivating agents, partially converting metal surface to metal halides. For example, $I_2$ can be used. In other embodiments certain hydrocarbons may be used as passivators, partially converting the metal surface to metal carbide. The passivating reagent is preferably selected such that it can modify metal surface without the use of plasma. In one embodiment, the passivating reagent is introduced in a controlled fashion, such that the metal surface is not entirely converted to passivated material, but still contains unpassivated metal atoms, which can be converted to a PSAB material during subsequent PSAB forming operation. A substrate having a partially passivated surface is illustrated in FIG. 4B. In this example metal nitride 407 is formed within an upper portion of metal layer 405. Metal nitride 407 occupies only a fraction of exposed surface, with a certain amount of metal 405 being available to subsequent transformations. The degree of passivation of the metal surface, can be controlled by parameters of the passivating process, such as nature of the passivating reagent, temperature, flow rate of passivating reagent and contact time of reagent with the metal layer.

In one embodiment, copper surface is partially converted to $Cu_xN_y$ by flowing $NH_3$ into a process chamber at a flow rate of about 6000-8000 sccm, at a pressure of about 1.5-4 Torr and at a temperature of about 200° C.-400° C. In this embodiment, plasma is not ignited during the passivation process. In other embodiments, passivation may be plasma-assisted. In some embodiments $NH_3$ is the only gas that is flowed into the chamber during passivation operation. In other embodiments, $NH_3$ or other passivating reagent may be diluted by a carrier gas, such as $N_2$, $H_2$, He, Ar, etc. The metal layer is contacted with the passivating reagent for a controlled period of time that provides the desired amount of passivated material at the metal surface. For example, the substrate can be treated with $NH_3$ for about 2-4 seconds to convert a desired fraction of copper surface to copper nitride.

In one embodiment, the passivating operation selectively transforms metal surface without affecting other exposed surfaces of the substrate. For example, passivating operation 305 in this embodiment does not transform the dielectric layer and does not deposit any material on a layer of dielectric.

Referring again to FIG. 3A, the PSAB process follows by forming a first PSAB layer within the top portion of the metal layer. As shown in the process block 307, the partially fabricated device is contacted with a second reactant to form a first PSAB layer. The second reactant reacts with the available metal atoms of the metal layer, but preferably does not affect materials elsewhere on the wafer (e.g., does not react or deposit any material on a dielectric layer), and does not react with the passivated material. Consequently, the depth of the first PSAB layer correlates with the amount of passivated material formed during operation 305, such that increased amount of passivated material at the metal surface leads to decreased thickness of the PSAB layer. Therefore, the thickness of the PSAB layer and resistance of interconnect is controlled by the amount of passivated material formed in operation 305, or, rather by the amount of unpassivated metal atoms that remain available for transformation. For example, if all of the metal atoms at the metal surface are converted to passivated material, such as $Cu_xN_y$, the PSAB layer would not form, while if no passivating operation precedes PSAB-forming operation 307, the first-formed PSAB layer may be excessively thick, thereby unnecessarily increasing interconnect resistance.

In some embodiments the second reactant (also referred to as PSAB-forming reactant) comprises a gas or a vapor, selected from the group consisting of $SiH_4$, $GeH_4$, $PH_3$, $B_2H_6$, $AsH_3$, an alkane, $H_2S$, $H_2Se$, and $H_2Te$. Further, a variety of metal hydrides and alkylated element hydrides can be used. Examples include $SnH_3$, $SbH_3$, and $RGeH_3$, $R_2GeH_2$, $R_3GeH$, wherein R is an alkyl substituent, which can be further substituted with heteroatoms, such as N, P, and S. In some embodiments, metal halides (fluorides, chlorides, bromides or iodides) are used for forming PSAB layers. For example, in some embodiments, molybdenum halides are used. In these cases, inter-metal compounds and alloys (e.g. $Cu_xMo_y$) are formed as first PSAB layers. In general, a variety of metal hydrides and/or halides or alkyl substituted hydrides and/or halides which could be delivered into a CVD chamber in their gaseous forms could be employed as PSAB forming reactant. Further, in some embodiments, a variety of metal containing compounds (including organometallics) that could be delivered into the CVD chamber in its gaseous form could be used as PSAB forming reactants. Examples include alkyl, carbonyl, and cyclopentadienyl-substituted organometallic compounds, such as tetrakisdimethylaminotitanium, cyclopentadieneyl molybdenum, nickel tetracarbonyl and iron pentacarbonyl. Typically, such compounds would impregnate top portions of copper lines with thin layers of metals, e.g., Ti, Mo, Ni, Fe and the like to form alloys with copper.

The second reactant (PSAB-forming reactant) contacts the semiconductor substrate under such conditions that top portion of the metal is converted to a first PSAB layer, comprising a material selected from the group consisting of $M_xSi_y$, $M_xGe_y$, $M_xP_y$, $M_xB_y$, $M_xAs_y$, $M_xC_y$, $M_xS_y$, $M_xSe_y$, and $M_xTe_y$, where M is metal, when $SiH_4$, $GeH_4$, $PH_3$, $B_2H_6$, $AsH_3$, an alkane, $H_2S$, $H_2Se$, and $H_2Te$ reactants are used. For example a layer comprising $Cu_xSi_y$, $Cu_xGe_y$, $Cu_xP_y$, $Cu_xB_y$, $Cu_xAs_y$, $Cu_xC_y$, $Cu_xS_y$, $Cu_xSe_y$, or $Cu_xTe_y$ is formed. While in some embodiments formation of the first PSAB layer may be plasma-assisted, in many embodiments, including an embodiment in which $SiH_4$ contacts Cu to form $Cu_xSi_y$, plasma is preferably not ignited during formation of the first PSAB layer. When plasma is not applied, silane selectively reacts with metal surface, without depositing any material on other exposed surfaces of the wafer. For many PSAB forming reagents plasma should not be ignited during PSAB forming process, in order to achieve selective formation of PSAB layer within the metal surface, rather than blanket deposition of material across the wafer.

Figure 4C:
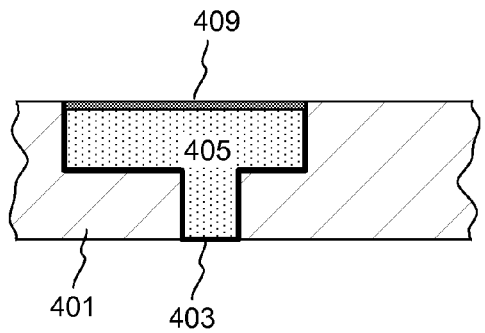

In some embodiments, the first PSAB layer is formed entirely within the top portion of the metal line. Such embodiment is illustrated in FIG. 4C, where the first PSAB layer 409 is self-aligned with the metal layer 405 and does not extend higher than the layer of surrounding dielectric 401. Layer 409 comprises, in one embodiment, metal silicide and metal nitride remaining from the passivating treatment (not shown). Layer 409 can also include metal (in zero oxidation state), which is impregnated with the above-mentioned materials.

In a particular example, the first PSAB layer is formed by flowing $SiH_4$ into a process chamber at a flow rate of about 100-1000 sccm. $NH_3$ at a flow rate of about 4000-10000 sccm or $H_2$ at a flow rate of about 4000-10000 sccm can be optionally flowed into the process chamber concurrently with silane. The $SiH_4$ treatment lasts for about 1-6 seconds at a temperature ranging from about 200-400° C. and pressure ranging from about 1.5-4 Torr. In some embodiments, it is preferable to keep the temperature lower than 300° C. in order to limit diffusion of nonconductive species into the metal line. In other embodiments, temperatures higher than 300° C. are used while diffusion of nonconductive species and via resistance are controlled using other methods (e.g., passivation and pinning) No plasma is applied in this embodiment, and $SiH_4$ selectively reacts only with the metal surface to form a copper silicide containing PSAB first layer In an alternative embodiment, the first PSAB layer may be formed by treating the substrate with a surface active reagent that selectively adsorbs on a metal surface. This embodiment is described in detail in U.S. application Ser. No. 10/980,076, which was previously incorporated by reference.

Some issues surrounding PSAB layer formation will be illustrated with reference to $Cu_xSi_y$ first PSAB layer. It is understood, that similar considerations may also apply to PSAB layers with other compositions.

When copper surface is contacted with silane at a certain temperature (e.g., between about 200° C.-400° C.), silane catalyitically decomposes at copper surface to form elemental silicon, which diffuses into the copper layer and slowly reacts with copper atoms to form $Cu_xSi_y$. Copper atoms that initially serve as a catalyst for silane decomposition eventually undergo a transformation to copper silicide, which is the main component of the first formed PSAB layer. In this scenario, a large amount of elemental silicon is initially formed in operation 307. Passivation of copper layer in operation 305 reduces the fraction of catalytic copper atoms in the zero oxidation state at the exposed surface, and thereby reduces the amount of elemental silicon that is initially formed. Passivation, in certain embodiments, may also play a role in limiting the diffusion of elemental silicon into the copper line. Therefore, passivation reduces the thickness of the first PSAB layer and provides a way to control resistance of PSAB-containing interconnects.

In some embodiments, it may also be desirable to further control the diffusion of elemental silicon (or other non-conductive material) into the metal lines. Diffusion of large amounts of non-conductive material into the metal line leads to unwarranted increase in metal line resistance which is controlled, in some embodiments, by an optional "pinning" operation shown in the process block 309 of FIG. 3. "Pinning" operation forms a dielectric cap on or within the first PSAB layer, and serves to limit the diffusion of non-conductive reaction intermediates or by-products into the depth of metal lines by converting them to a material that does not readily diffuse into the metal. Further, "pinning" operation may transform unstable phases of copper silicide or copper nitride to a more stable material. Even further, "pinning" operation forms a cap of dielectric material that has good adhesion with dielectric diffusion barrier materials. It is, therefore, often advantageous to form a "pinned" PSAB layer to improve such adhesion. "Pinning operation" is referred to as a "dielectric cap" formation in U.S. application Ser. No. 10/980,076, from which the current application claims priority. Further, in certain embodiments, pinning operation may reduce stress migration parameters of formed interconnects.

As shown in the process block 309 of FIG. 3, pinned PSAB layer is formed by contacting the device substrate with a reactant. In general, pinning can be accomplished by thermal treatment, plasma treatment, chemical treatment, or some combination of the three. In one embodiment, pinning is performed by contacting the substrate with a pinning reagent selected from the group consisting of $N_2$, $NH_3$, a hydrocarbon, a gas from the family of methyl-substituted amines, and mixtures thereof. In some embodiments silicon-containing pinning reagents, such as a gas from the family of methyl-substituted silanes or HMDS may be used. Preferably, modification of the first PSAB layer with the pinning reagent is performed with plasma treatment. In one embodiment, the first PSAB layer containing $Cu_xSi_y$ is treated with $NH_3$ in a plasma. Under conditions practiced in this embodiment, excess of elemental silicon residing within and/or on the surface of metal line is transformed into silicon nitride, which does not readily diffuse into the bulk of metal layer. Further, under conditions of such pinning, $Cu_xSi_y$ is partially or completely transformed to copper metal (at zero oxidation state) impregnated with silicon nitride, thereby forming an excellent adhesive layer at the interface of metal fill and a dielectric diffusion barrier.

In a particular example, a substrate having a $Cu_xSi_y$ first PSAB layer is treated with $NH_3$ and $N_2$ in a plasma generated using HF and LF power sources. $NH_3$ is introduced into a process chamber at a flow rate of about 6000-8000 sccm. $N_2$ is flowed into the chamber at a flow rate of about 2000-4000 sccm. The substrate is treated at a temperature of about 200-400° C., and pressure of about 1.5-4 Torr for a period of time ranging from about 3 to 20 seconds. Plasma is ignited using HF and LF power sources at a total power level of about 200-1000 W for one 300 mm wafer. As a result, a pinned PSAB layer containing $Si_xN_y$ is formed.

Note that in some embodiments the same reagent may be used during the passivation operation 305 and a pinning operation 309. For example, in some embodiments, $NH_3$ is used as a passivating reagent without use of plasma and as a pinning reagent in a plasma-enhanced process. Further, in some embodiments, $NH_3$ is also used in the pre-cleaning step and as an auxiliary gas during formation of the first PSAB layer.

In some embodiments, (including embodiments employing hydrocarbon and silicon containing pinning reagents) pinning conditions are preferably selected such that only the first PSAB layer is transformed, while no substantial deposition occurs elsewhere on the wafer, e.g., on a dielectric field. Preferably, in these embodiments no more than 10 Å of material is deposited elsewhere on the dielectric field regions of the wafer.

Figure 4D:
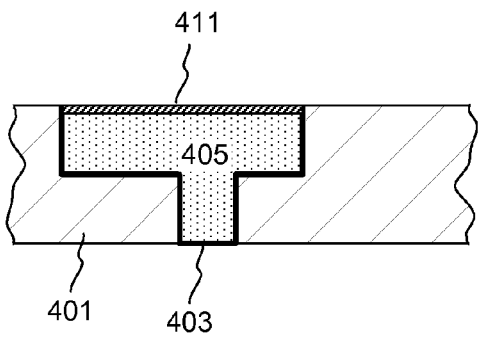

Depending on a reagent that is used in pinning, the pinned PSAB layer may contain $Si_xN_y$, $Si_xC_y$, hydrogen-doped carbon or a combination of these materials. For example, treatment with hydrocarbons will result in $Si_xC_y$ or C:H-containing pinned PSAB layer, while treatment with $NH_3$ and $N_2$ will result in $Si_xN_y$ containing pinned PSAB layer. FIG. 4D illustrates a cross-section of a device having a pinned PSAB layer 411. In this example, pinning has transformed an entire first PSAB layer to a pinned layer having a different composition. In this example pinned PSAB layer resides entirely within the top portion of the metal line 405 and does not extend higher than the level of surrounding dielectric 401. In other embodiments, pinning may result in a layer that is higher than the layer of surrounding dielectric. For example, if substantial amount of elemental silicon formed on the surface of metal layer 405 is transformed to silicon nitride, the pinned PSAB layer (or a dielectric cap) may be higher than the level of surrounding dielectric. In some embodiments, the entire first PSAB layer is transformed to a pinned PSAB layer. For example, all of the copper silicide of the first PSAB layer may be converted to silicon nitride. In other embodiments, certain amounts of material of the first PSAB layer may not be transformed during pinning. For example, certain particularly stable phases of copper silicide may remain in the pinned PSAB layer. Yet, in other embodiments, only the top portion of the first PSAB layer may be transformed by pinning (partially or completely), thereby forming a bi-layer structure. For example, the pinned PSAB layer may have a bottom layer that contains copper silicide, and a top layer that contains silicon nitride. Typically concentrations of components gradually change within the PSAB layers, thereby providing for good adhesion between metal and a dielectric.

In some cases, pinning using hydrocarbons was found to be associated with improvement in stress migration parameters of interconnects. Hydrocarbons, as used herein, are defined as compounds with $C_xH_y$ composition, which may be optionally substituted with heteroatoms, such as S, N, P, etc. Hydrocarbons, as used herein include acyclic and cyclic alkanes, alkenes, alkynes, as well as amines, mercaptans, thioethers and phosphines. Examples of hydrocarbons that do not include heteroatoms and that can be used as pinning reactants are methane, ethane, ethylene, acetylene, propane, propene, propyne, cyclopropane, cyclobutane, butanes, butenes, butynes, and benzene.

Pinning with hydrocarbons results in chemical transformation of the first PSAB layer leading to a structure with slower migration of vacancies in a via.

In some embodiments, pinning is performed exclusively with hydrocarbons in a plasma without $NH_3$, $N_2$ and other pinning reagents. In other embodiments, mixtures of pinning reagents (e.g., $NH_3$, $N_2$,) with a hydrocarbon may be used during plasma-assisted pinning Hydrocarbon content in the process gas can range from about 0.0001% (trace values) to 100%, preferably from about 1% to 100% by volume. Pressure, temperature, and plasma conditions for hydrocarbon pinning can be similar to those described above for $NH_3$ pinning. In one embodiment the first PSAB layer is treated with a mixture of $NH_3$ (or $N_2$) flowed into the process chamber at the flow rate range of between about 500 sccm to 5000 sccm and cyclopropane flowed in the range of 2.5 sccm to 5000 sccm per one 300 mm wafer using a plasma. When such treatment is performed on $Cu_xSi_y$ PSAB layer containing a $Si_xC_yN_z$ material is typically formed.

In another embodiment a hydrocarbon is flowed into the process chamber without being mixed with other pinning reagents. For example, cyclopropane can be flowed into the chamber at a flow rate ranging from about 2.5 to 5000 sccm per one 300 mm wafer. The plasma is then ignited under similar conditions or under slightly modified conditions, as described for $NH_3$ pinning and the first PSAB layer is modified by hydrocarbon pinning. When such treatment is performed on $Cu_xSi_y$ PSAB layer containing a $Si_xC_y$ material is typically formed.

It was also found that treatment of PSAB layers with $H_2$ plasma during or after pinning improves stress migration characteristics of interconnects. $H_2$ plasma chemically modifies the surface of the PSAB layer and leads to structures with lower stress migration, presumably also by slowing the migration of vacancies within the via. In some embodiments $H_2$ is included into the process gas used during pinning. Examples of mixtures of pinning reagents with $H_2$, which can be used include: $NH_3$ and $H_2$; $N_2$ and $H_2$; $NH_3$, $N_2$, and $H_2$; hydrocarbon, $NH_3$, and $H_2$; hydrocarbon, $N_2$, and $H_2$. In one embodiment, $H_2$ plasma treatment is used instead of pinning (no other pinning reagents added). Other combinations of pinning reagents (e.g., ternary mixtures) with hydrogen may be used, as will be understood by those of skill in the art. $H_2$ can be supplied into the process chamber at a flow rate ranging from 40 to 20000 sccm per four 300 mm wafers or 10 to 5000 sccm per one 300 mm wafer. In some embodiments $H_2$ comprises at least 0.01% of the total gas flow during pinning, preferably between 1 and 50%. Plasma, temperature, and pressure conditions for pinning which includes $H_2$, can be similar to those listed for $NH_3$ pinning.

In some embodiments, $H_2$ plasma treatment is performed after the pinning operation is completed, as shown by process block 310 of FIG. 3A. During $H_2$ plasma post-treatment, $H_2$ can be supplied to the process chamber either alone or concurrently with inert carrier gas at a flow rate ranging from about 40 to 20000 sccm per four 300 mm wafers or 10 to 5000 sccm per one 300 mm wafer. Plasma, temperature, and pressure conditions for $H_2$ post-treatment can be similar to those listed above for $NH_3$ pinning operation.

Figure 3B:
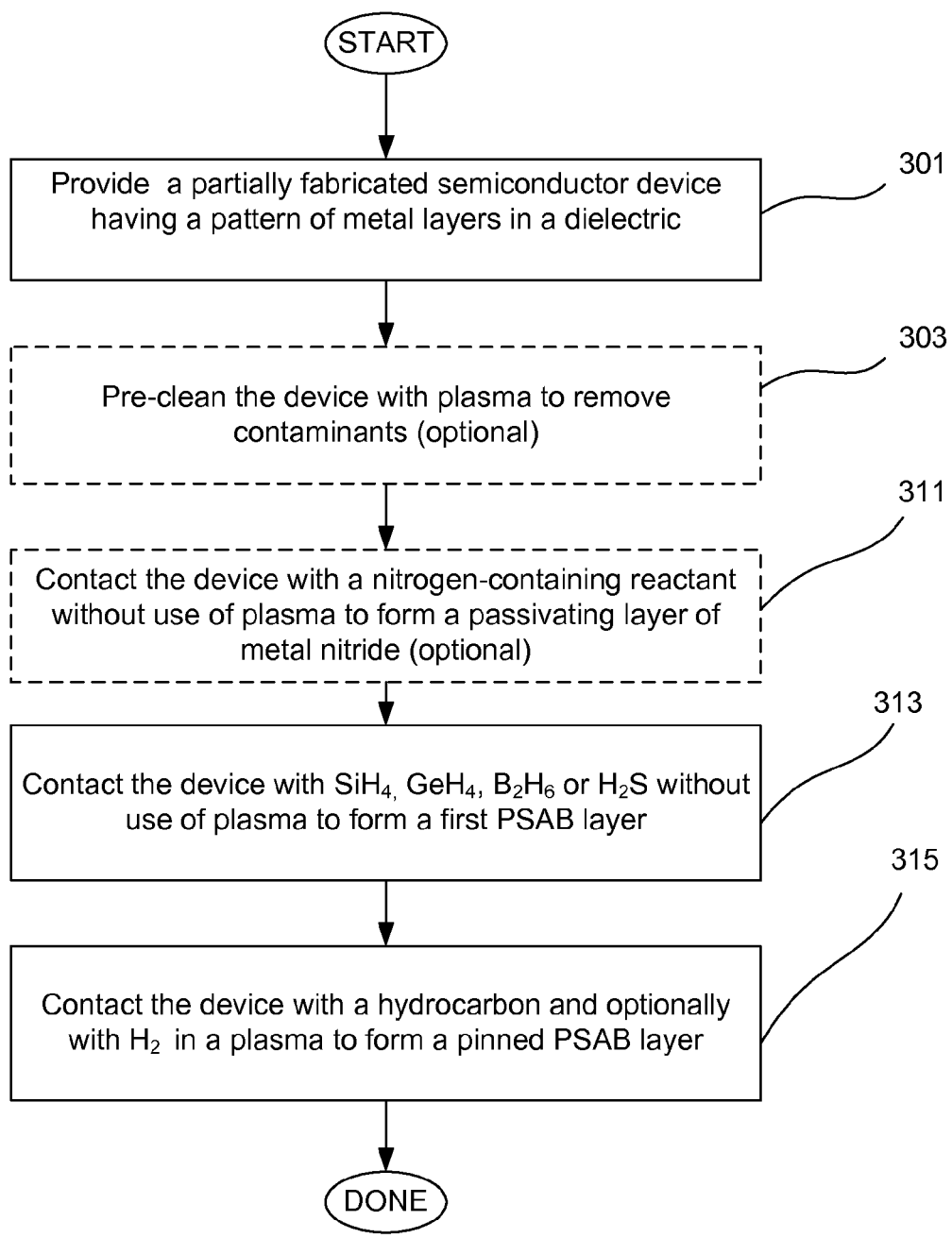
Figure 3C:
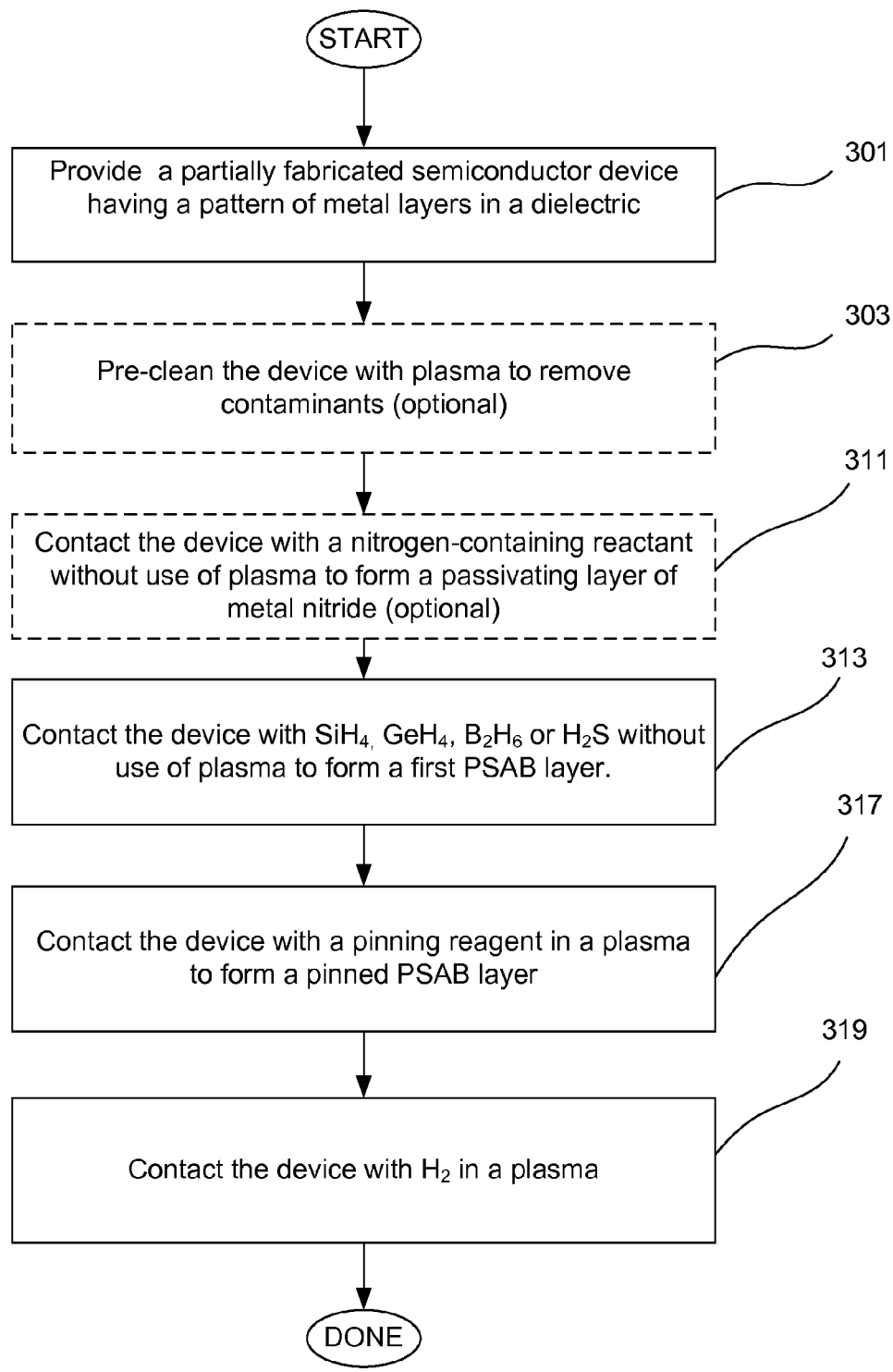

FIGS. 3B and 3C present process flow diagrams for specific examples of PSAB forming processes. In these and other embodiments the passivation operation 303 may be optional. Referring to FIG. 3B, the process starts as described previously by providing a partially fabricated semiconductor device having a pattern of metal layers in a dielectric, in process block 301. The device is optionally pre-cleaned with plasma in operation 303 and, the metal layer is optionally passivated using a passivating reactant (e.g., a nitrogen-containing passivating reactant) without use of plasma in an operation 311. Then the device is contacted with a PSAB forming reactant, such as $SiH_4$, $GeH_4$, $B_2H_6$ or $H_2S$ without use of plasma to form a first PSAB layer in an operation 313. Finally, the device is contacted with a hydrocarbon and optionally with $H_2$ in a plasma to form a pinned PSAB layer in an operation 315. In other embodiments the PSAB process may end with pinning using $NH_3$ and $H_2$ in a plasma, hydrocarbon and $NH_3$ in a plasma, or with pinning using other reactant combinations as described above.

In an embodiment described in a process flow diagram of FIG. 3C, the process flows analogously to the process shown in FIG. 3B until operation 313. After formation of the first PSAB layer in operation 313, the device is treated with a pinning reagent in a plasma to form a pinned PSAB layer in operation 317. Examples of pinning reagents include $N_2$, $NH_3$, a hydrocarbon, a gas from the family of methyl-substituted silanes, a gas from the family of methyl-substituted amines, HMDS, and mixtures thereof. After pinning, the flow of the pinning reactant is stopped, and the device is subjected to $H_2$ plasma post-treatment as shown in the process block 319.

Figure 4E:
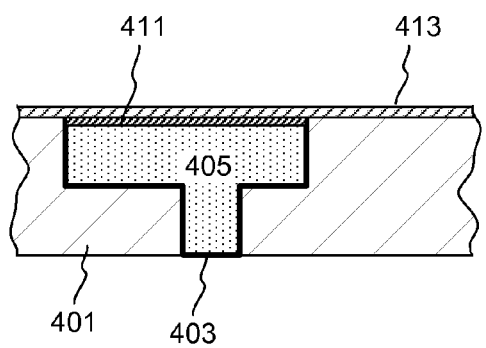

After the pinned and/or $H_2$ treated PSAB layer is formed, a dielectric diffusion barrier layer is deposited on top of the PSAB layer 411 and a dielectric 401. Cross-sectional depiction of a resulting structure is shown in FIG. 4E. Dielectric diffusion barrier layer is preferably deposited in the same vacuum environment as the PSAB layer, without exposing the substrate to moisture or oxygen. In some embodiments the dielectric diffusion barrier is deposited in the same process chamber in which the PSAB layer has been deposited, e.g., in a process chamber of a PECVD apparatus. The dielectric diffusion barrier may include, for example, silicon carbide based materials, such as silicon carbide, which may be doped with nitrogen, oxygen, boron etc. In some embodiments it is particularly desirable to use low-k diffusion barrier layers formed on top of PSAB-capped lines and ILD. In one embodiment use of oxygen doped silicon carbide (ODC) is particularly preferred. ODC material typically has a low dielectric constant (e.g., less than 4.0), and is therefore a desired diffusion barrier material. However, in the absence of PSAB capping, direct deposition of ODC layers on top of copper lines, resulted in oxidation of copper and deterioration of interconnect properties. PSAB technology allows use of ODC diffusion barrier formed on top of PSAB layer, since copper is protected from oxidation by PSAB material. ODC layers can be formed by PECVD using silicon, carbon, and oxygen-containing precursors.

In some embodiments deposition of a dielectric diffusion barrier layer is performed at a temperature that is higher than the temperature used in the PSAB formation (including passivation and pinning operations). For example, in some embodiments, PSAB formation is implemented at a temperature under 350° C., e.g., at about 250-300° C., while diffusion barrier deposition is performed at a temperature of at least about 350° C., e.g., 375-450° C.

After the diffusion barrier has been deposited, an interconnect may be formed using conventional Damascene processing, such as described with reference to FIGS. 1A-1E.

The methods described above provide interconnects with controllable resistance and/or improved stress migration characteristics. The thickness of PSAB layers formed by these methods can range from about 10 Å to 10000 Å. It is especially advantageous that these methods provide control over thickness of PSAB layers in the range of about 10-100 Å, particularly at a 10-60 Å range. PSAB films ranging in thickness from about 10-60 Å can provide interconnects with particularly small resistance shifts of less than 1% and less than 3%, that are currently demanded in the IC industry.

Further, introduction of passivating operation into a PSAB forming process provides a greater working range for other parameters of the process. For example, diffusion of non-conducting material into the bulk of metal layer was minimized by using a relatively low temperature of less than about 280° C. during formation of the first PSAB layer. With the use of passivating technique, diffusion control may become relatively less important, and temperatures higher than 280° C., e.g., between about 300-400° C. can be used. It is understood, however, that in other embodiments, diffusion control may still remain important and formation of first PSAB layer may be optimal at about 250-300° C.

Apparatus

The present invention can be implemented in many different types of apparatus, such as chemical vapor deposition (CVD) reactors and spin-coating systems. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing the PSAB layer and barrier layer deposition is transferred from one station to another within the reactor during the process. While in process, each wafer is held in place by a pedestal, wafer chuck and/or other wafer holding apparatus. For certain operations in which the wafer is to be heated, the apparatus may include a heater such a heating plate. In a preferred embodiment of the invention, a PECVD system may be used. In even more preferred embodiments the PECVD system includes a LF RF power source.

Figure 5:
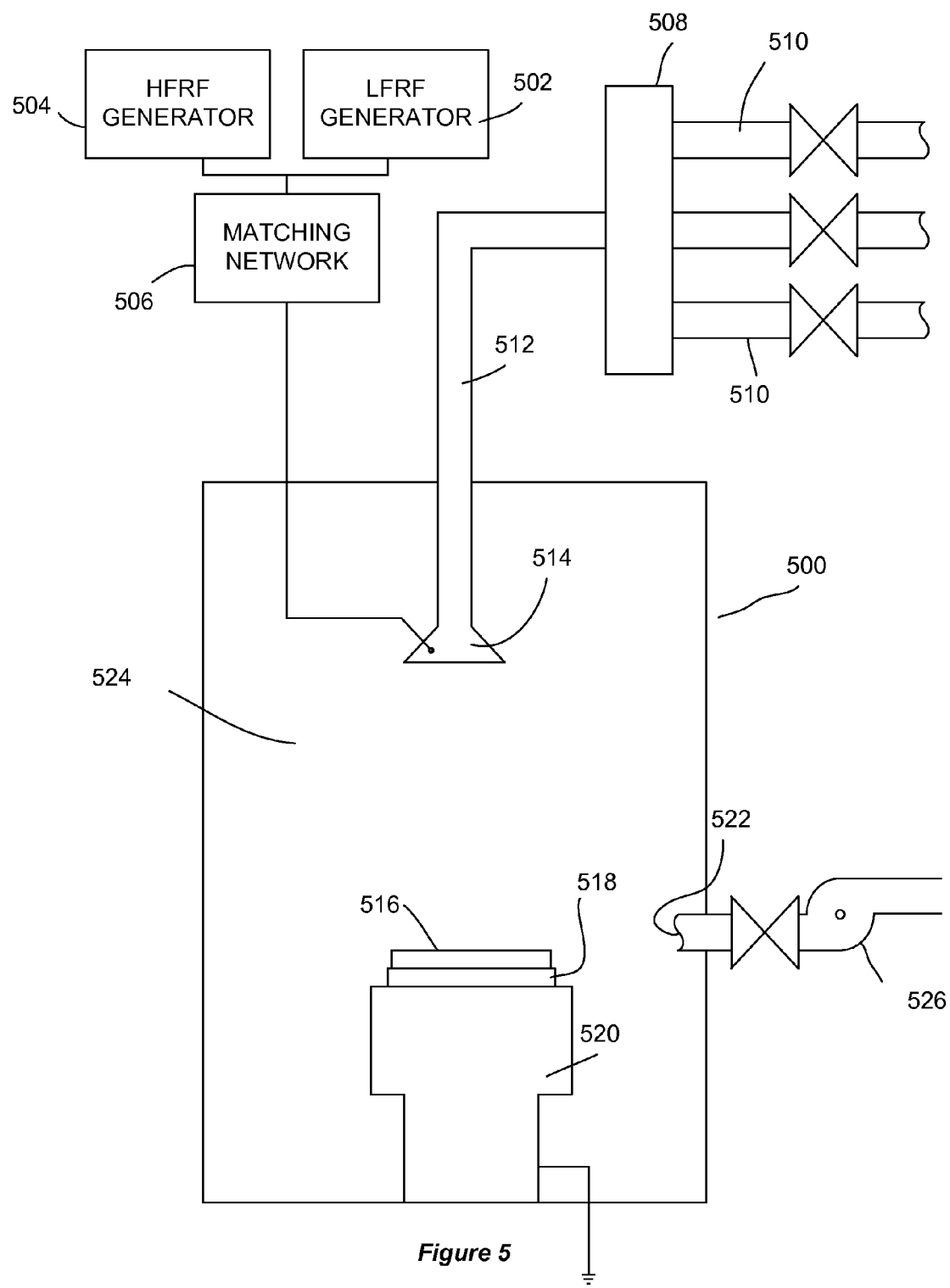
FIG. 5 is a schematic representation of a PECVD apparatus capable of using low frequency (LF) and high frequency (HF) radio frequency plasma sources that can be used for forming PSAB layers in accordance with some embodiments of present invention.

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 502 and a low-frequency RF generator 504 are connected to a matching network 506 that, in turn is connected to showerhead 514.

Within the reactor, a wafer pedestal 518 supports a substrate 516. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the pre-cleaning, passivation, PSAB formation and pinning phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 6:
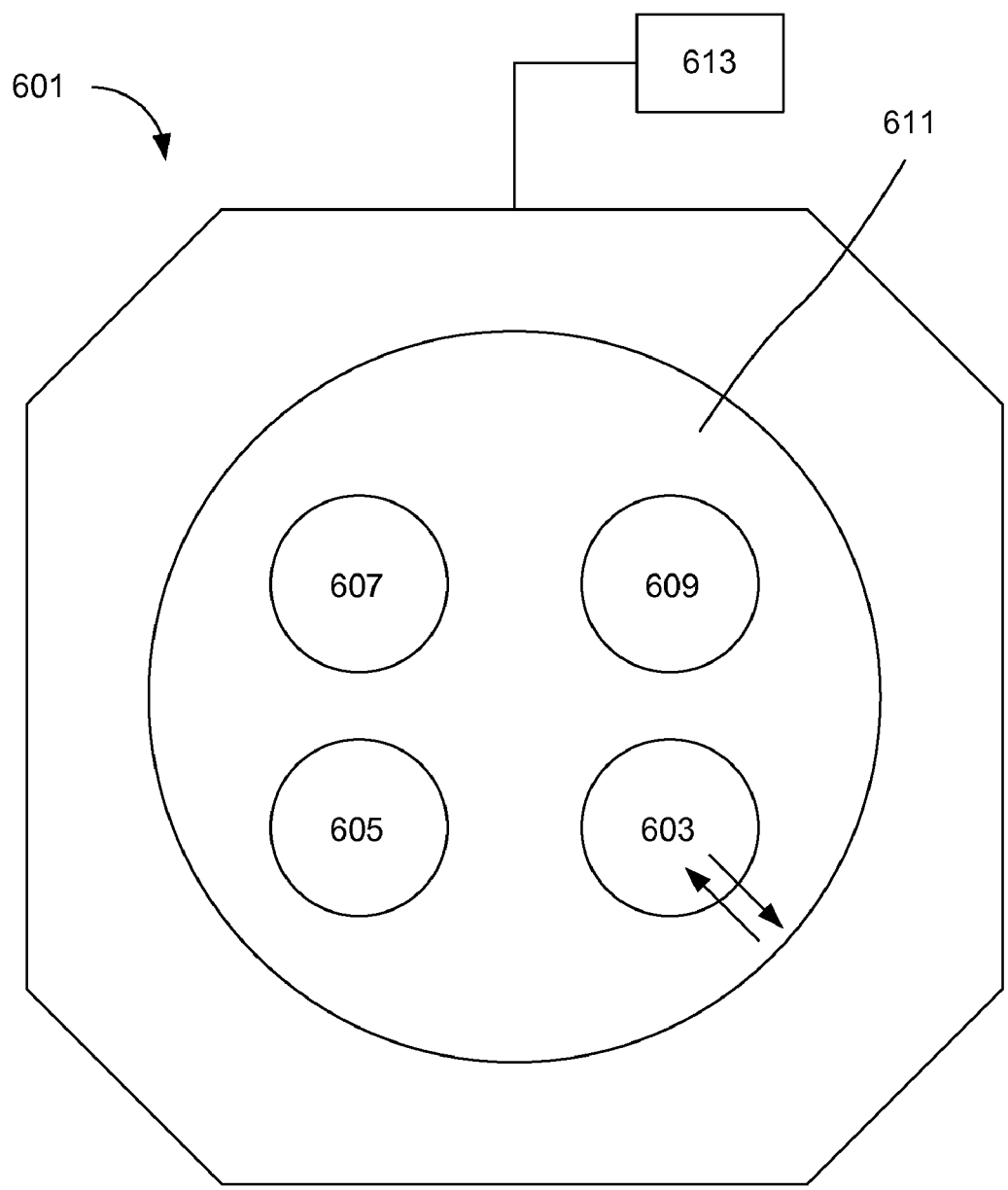
FIG. 6 is a schematic representation of one example of a multi-station apparatus suitable for forming PSAB layers in accordance with some embodiments of present invention.

In one of the embodiments a multi-station apparatus may be used for forming a PSAB layer and a diffusion barrier. The multi-station reactor allows one to run different processes concurrently in one chamber environment, thereby increasing the efficiency of wafer processing. One example of such an apparatus is depicted in FIG. 6. A schematic presentation of top view is shown. An apparatus chamber 601 comprises four stations 603-609. In general, any number of stations is possible within the single chamber of a multi-station apparatus. Station 603 is used for loading and unloading of the substrate wafers. Stations 603-609 may have the same or different functions. For example, some of the stations may be devoted to PSAB formation operation, while other stations may be used for depositing the dielectric diffusion barrier film.

In one of the embodiments, individual stations can operate under distinct process conditions and may be substantially isolated from each other. For example one station may operate under one temperature regime, while another may operate under a different temperature regime.

In one embodiment, pre-cleaning operation and PSAB layer formation process are performed in one preferred temperature regime and are carried out in one station of the multi-station apparatus. The $H_2$ plasma post-treatment and deposition of a dielectric diffusion barrier may require a different temperature regime in some embodiments, and may be carried out in a different station or stations. In other embodiments $H_2$ plasma post-treatment is performed under the same temperature regime as the PSAB formation and at the same station that performs PSAB formation. In some embodiments, the entire PSAB-forming process including pre-treatment, passivation, first PSAB layer formation, pinning, and $H_2$ plasma post-treatment is performed in one station of a single station or a multi-station apparatus. In some embodiments, deposition of a dielectric diffusion barrier layer may be also performed at the same station as PSAB layer formation.

In one embodiment example, station 605 may be devoted to pre-clean and to formation of the PSAB layer. Station 605 may operate at a temperature range of about 200-300° C., which is preferred in some embodiments for both PSAB formation and pre-clean operation. $H_2$ plasma post treatment can be carried out at station 607 at a temperature range of about 200-400° C. Deposition of dielectric diffusion barrier material, such as silicon carbide, can be carried out in stations 607, 609, and 603 at a temperature range of about 350 to 400° C., which is the preferred process temperature according in some silicon carbide deposition processes.

Advantageously, pre-clean, passivation, first PSAB layer formation and pinning, may require similar conditions in some embodiments, and can be performed at one station 605.

According to an embodiment described above, station 605 is a pre-clean station and a PSAB formation station. Station 607 serves for $H_2$ plasma post-treatment and for deposition of dielectric diffusion barrier layer. Stations 607, 609, and 603 may all serve for deposition of dielectric diffusion barrier layer. An indexing plate 611 is used to lift the substrates off the pedestals and to accurately position the substrates at the next processing station. After the wafer substrate is loaded at station 603, it is indexed to station 605, where formation of the pre-clean and PSAB layer formation (including all its sub-processes except for $H_2$ post-treatment) is performed. The wafer is then moved to station 607 where $H_2$ plasma post-treatment and deposition of diffusion barrier dielectric is performed. The substrate is further indexed to station 609, where further deposition of barrier dielectric is performed, and then indexed to station 603 to deposit more of diffusion barrier dielectric. The processed wafer is unloaded at station 603, and the module is charged with a new wafer. During normal operation, a separate substrate occupies each station and each time the process is repeated the substrates are moved to new stations. Thus, an apparatus having four stations 603, 605, 607, and 609 allows simultaneous processing of four wafers, wherein at least one station performs a process that is different from the processes performed at other stations. Alternatively, four wafers may be subjected to identical operations at all four stations, without dedicating certain stations to deposition of a particular layer.

The process conditions and the process flow itself can be controlled by a controller unit 613 which comprises program instructions for a monitoring, maintaining and/or adjusting certain process variables, such as HF and LF power, gas flow rates and times, temperature, pressure and the like. For example, instructions specifying flow rates of silane and ammonia for PSAB deposition may be included. The instructions may specify all of the parameters to perform operations, according to methods described above. For example, instructions may include parameters of pre-clean, passivation, first PSAB layer formation, pinning operations, $H_2$ plasma treatment, and dielectric diffusion barrier deposition The controller may comprise different or identical instructions for different apparatus stations, thus allowing the apparatus stations to operate either independently or synchronously.

Figure 7:
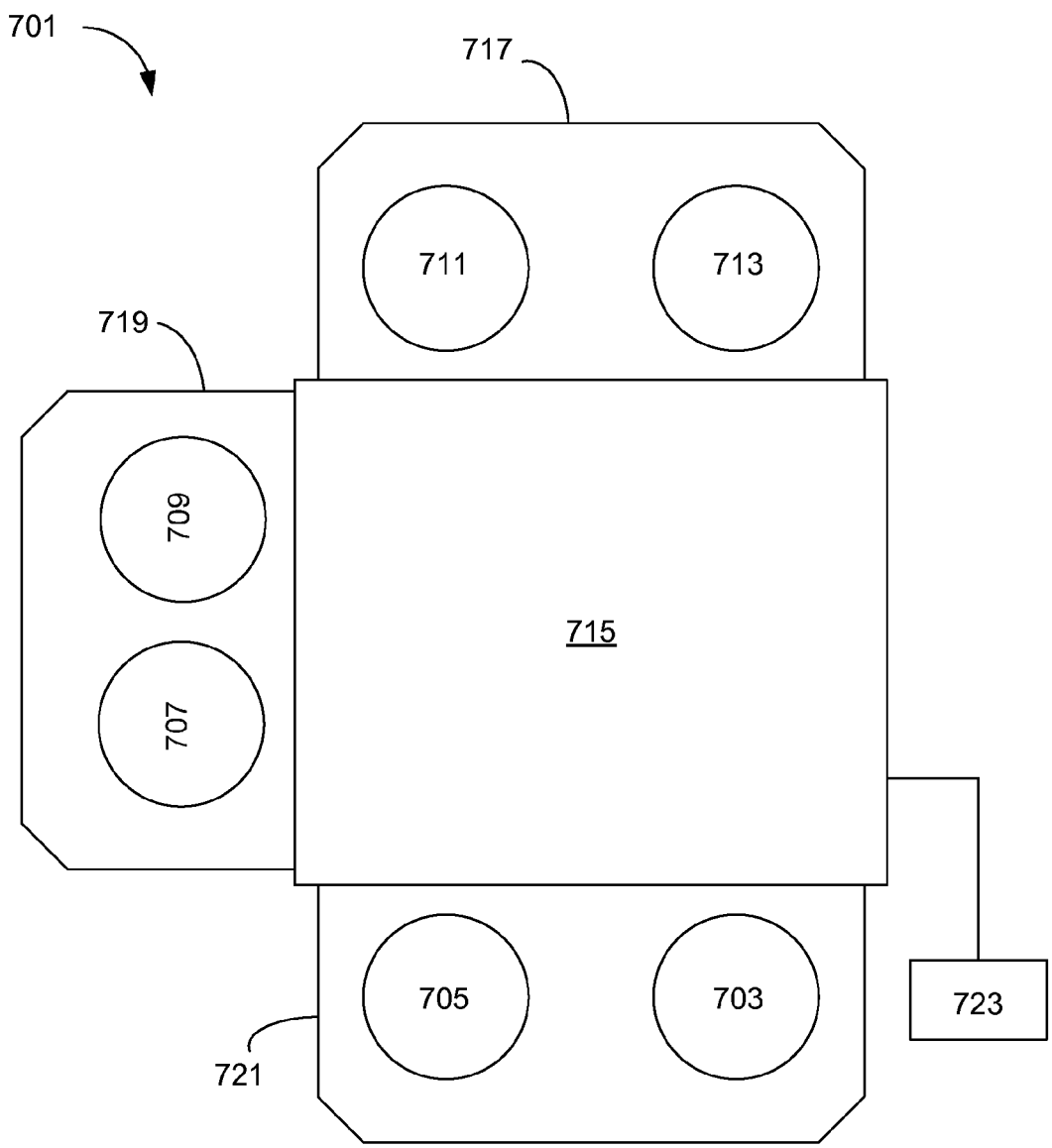
FIG. 7 is a schematic representation of another example of a multi-station apparatus suitable for forming PSAB layers in accordance with some embodiments of present invention.

Another example of a multi-station apparatus is illustrated in FIG. 7. The multi-station apparatus 701 includes six stations 703, 705, 707, 709, 711, and 713 residing in three separate processing chambers 717, 719, and 721, with two stations residing in each chamber. A robot-containing chamber 715 adjacent chambers 717, 719, and 721 provides mechanism for loading and unloading the wafers into the stations. A controller 723 provides instructions for operation of a multi-station apparatus 701. Individual stations within one chamber are isolatable from each other and may carry out identical or different operations. In one embodiment, two wafers are simultaneously transferred to stations 703 and 705 residing in one chamber 721 and simultaneously undergo identical operations including pre-clean, passivation, first PSAB layer formation and pinning. After this process is completed, the two wafers are removed from the chamber 721, and are simultaneously introduced to stations 707 and 709 residing in chamber 709. In this chamber, a diffusion barrier material layer is simultaneously deposited. The wafers are then removed from chamber 719, and are introduced to stations 711 and 713 residing in chamber 717, where further processing follows. In some embodiments, formation of PSAB layer may be performed in a multi-chamber apparatus with different PSAB subprocesses performed in different chambers.

There is a variety of ways, in which the PSAB forming process can be implemented in multi-station tools, such as those shown in FIG. 6 and FIG. 7. In general, the described PSAB process is easily integrated into the Damascene flow, does not require substantial resource-consuming handling of substrates, and can be performed in the same apparatus as a dielectric diffusion barrier deposition. Further, resistance control via a passivation operation prior to PSAB layer formation is particularly advantageous, since it normally does not require any additional resources than those normally used for PSAB formation and dielectric diffusion barrier deposition. Improvement of stress migration parameters is also achieved using the same PECVD platform.

Several embodiments of the described methods will now be illustrated by specific examples.

EXAMPLES

Figure 8:
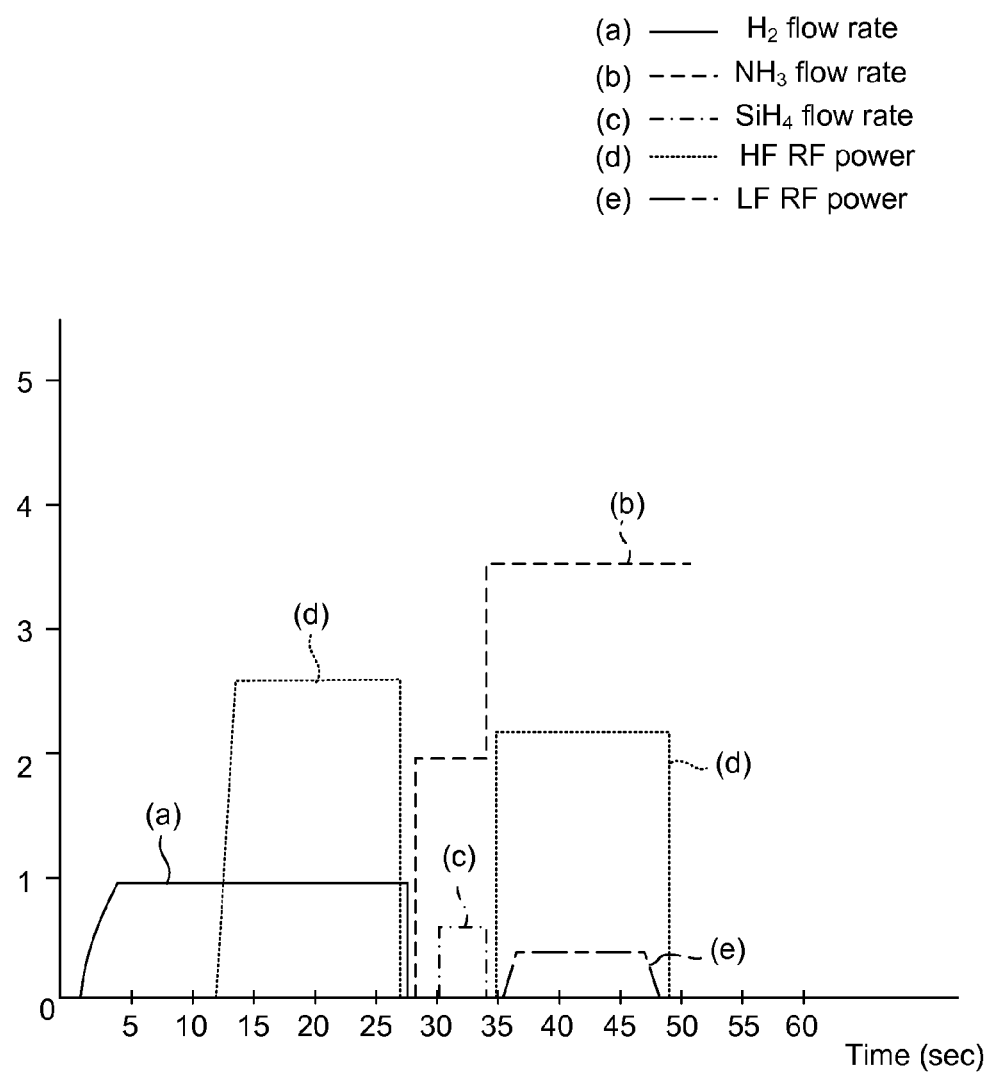
FIG. 8 is an experimental diagram, illustrating flow of reactants and plasma parameters as a function of time during PSAB-forming process.

One example of a PSAB-forming process is illustrated in an experimental timing diagram shown in FIG. 8. Flow rates of process gas components and plasma parameters are plotted as a function of time. X-axis lists process time in seconds, and Y-axis lists arbitrary parameters that correlate with flow rates and plasma power. Curve (a) corresponds to $H_2$ flow, curve (b)

to $NH_3$ flow, and curve (c) to $SiH_4$ flow. Curve (d) corresponds to HF RF power level, and curve (e) to LF RF power level.

In the described example, the process is started by a plasma pre-clean operation. The partially fabricated semiconductor device having an exposed pattern of copper lines in a dielectric was obtained after a CMP operation, and was placed into a process chamber of a PECVD VECTOR™ apparatus. The entire PSAB-forming process was performed at one station of a four-station apparatus. First, the substrate was pre-heated to 275° C., and $H_2$ was introduced into the process chamber at a flow rate of 4000 sccm. $H_2$ was flowed from second 2 to second 28 of the process time at a pressure of 4 Torr. At second 13, HF RF plasma was ignited and was sustained at a power of 1.23 W/cm² until second 28 of the process time. After the substrate was pre-cleaned with $H_2$ plasma, $H_2$ flow and plasma power were turned off, and $NH_3$ was introduced into the process chamber to effect the partial passivation of metal surface. $NH_3$ was flowed from second 28 to second 30 of the process time at a flow rate of 4000 sccm and pressure of 2.3 Torr. After the metal surface has been partially passivated, $SiH_4$ was introduced into the process chamber and was flowed from second 30 to second 34 at a flow rate of 120 sccm. $NH_3$ was flowed concurrently with $SiH_4$ at a flow rate of 4000 sccm. The first PSAB layer was formed at seconds 30-34 of the process, and was subsequently pinned. Pinning occurred at seconds 35-47. During pinning, $SiH_4$ flow was turned off, $NH_3$ flow was increased to 7000 sccm along with $N_2$ flow at 2800 sccm and was maintained at this rate at seconds 35-47. Plasma having an HF component at a power level of 0.80 W/cm², and an LF component with power level of 0.37 W/cm² was ignited and was maintained from second 35 to second 47. The described processing sequence provided a completed substrate with a pinned PSAB layer having a depth of less than about 20 Å. The entire PSAB-forming process was performed in a single station at a temperature of 275° C. Subsequently, a $Si_xC_yN_z$ diffusion barrier layer was deposited on the substrate in a different station of the PECVD apparatus at 350° C. using tetramethylsilane, ammonia, and nitrogen as a process gas in a plasma. In another example, a $Si_xC_yO_c$ ODC dielectric diffusion barrier was deposited using tetramethylsilane and carbon dioxide in a plasma.

The obtained PSAB layer was analyzed using X-ray photoelectron spectroscopy (XPS). This method of analysis provided information on the chemical composition of silicon-containing species in the layer. It was determined that the obtained pinned PSAB layer contained 1.3% of silicon as $Cu_xSi_y$; 91.4% of silicon as $Si_xN_y$; and 7.4% of silicon as $SiO_2$. The interconnect formed using the described above method of PSAB-layer formation exhibited resistance shift of about 1%.

For comparison purposes, the PSAB layer was formed using an identical procedure as described above, but lacking the $NH_3$ passivating operation. As expected the formed PSAB layer had a greater depth of more than 20 Å. The interconnect with such PSAB layer had a resistance shift of 3%. XPS data for such PSAB layer provided that silicon in this PSAB layer was seen as 16.9% $Cu_xSi_y$, 73% $Si_xN_y$; and 10.1% as $SiO_2$.

As it can be seen, partial passivation operation can be used to control the resistance of PSAB-containing interconnects, as well as the composition, and the thickness of the PSAB layer. Passivation is easily integrated into the PSAB process, and does not require additional equipment or substantial additional time.

Another example illustrates use of hydrocarbon pinning and $H_2$ plasma treatment for improvement of via stress migration characteristics. Via stress migration can be quantified by measuring the resistance of a string of connected vias before and after a high temperature anneal process. The difference in resistance before and after anneal corresponds to a via resistance shift (not to be confused with resistance shift of PSAB-containing and PSAB-free metal lines). In this test the wafer is subjected to four cycles of thermal anneal between a temperature of 150 and 250° C. for 12 hours. When via reistance shift exceeds 20%, such via is considered to have unacceptable stress migration characteristics (bad via). Unacceptable stress migration is typically correlated with formation of voids in a via.

Figure 9:
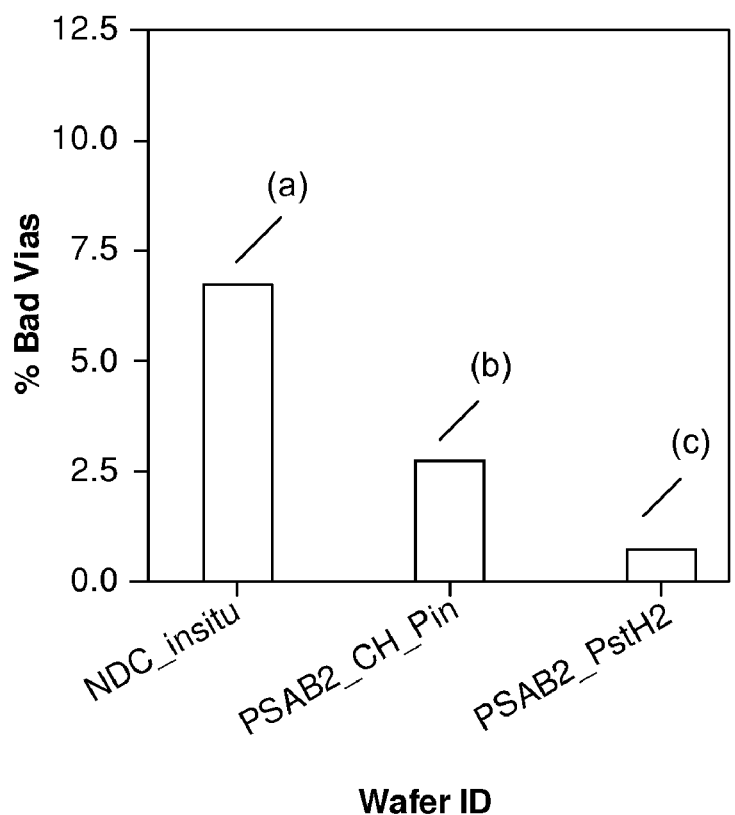
FIG. 9 is an experimental diagram, illustrating percentage of vias with unacceptable stress migration characteristics on a wafer for different interconnect forming processes.

FIG. 9 shows experimental data for the fraction of bad vias on a wafer for the process that does not involve formation of a PSAB layer (a), the process involving PSAB formation with hydrocarbon pinning (b), and the process involving PSAB formation with $H_2$ plasma post-treatment. It can be seen that stress migration parameters are significantly improved in processes presented by (b) and (c). PSAB formation with hydrocarbon pinning resulted in less than 3% of bad vias on the wafer, while the process with plasma post-treatment resulted in less than 2% of bad vias.

The PSAB process conditions used in the process with hydrocarbon pinning (b) are the following:

Plasma pre-clean: $H_2$ was flowed at 4000 sccm flow rate; plasma discharge included HF power of 740 W and no LF power. Pre-clean was performed at 4.2 torr and 275° C. for 15 seconds.

$NH_3$ passivation was not used.

Formation of first PSAB layer: $SiH_4$ was flowed at 120 sccm concurrently with $NH_3$ at 4000 sccm. No plasma was applied. The process was performed at 2.3 torr and 275° C. for 2 seconds Pinning: cyclopropane was flowed at 500 sccm concurrently with $NH_3$ at 7000 sccm and $N_2$ at 2800 sccm. Plasma at HF power level of 490 W and LF power level of 220 W was ignited. The process was performed at 2.3 torr and 275° C. for 12 seconds.

Diffusion barrier deposition: tetramethylsilane was flowed at 1260 sccm, concurrently with $NH_3$ at 4600 sccm, and $N_2$ at 3000 sccm. Plasma at HF power level of 275 W, and LF power level of 241 W was used. The process was performed at 3.9 torr and at 350° C. $Si_xC_yN_z$ diffusion barrier layer was formed.

The PSAB process conditions used in the process with $H_2$ plasma post-treatment (c) are the following:

$H_2$ was flowed at 4000 sccm flow rate; plasma discharge included HF power of 740 W and no LF power. Pre-clean was performed at 4.2 torr and 275° C. for 15 seconds.

$NH_3$ passivation was not used.

Formation of first PSAB layer: $SiH_4$ was flowed at 120 sccm concurrently with $NH_3$ at 4000 sccm. No plasma was applied. The process was performed at 2.3 torr and 275° C. for 2 seconds.

Pinning: $NH_3$ was flowed at 7000 sccm concurrently with $N_2$ at 2800 sccm. Plasma at HF power level of 490 W and LF power level of 220 W was used. The process was performed at 2.3 torr and 275° C. for 12 seconds.

$H_2$ plasma post-treatment: H2 was flowed at 9500 sccm. Plasma at HF power level of 200 W and no LF power was used. The process was performed at 2.3 torr and 350° C. for 6 seconds.

Diffusion barrier deposition: tetramethylsilane was flowed at 1260 sccm, concurrently with $NH_3$ at 4600 sccm, and $N_2$ at 3000 sccm. Plasma at HF power level of 275 W, and LF power level of 241 W was used. The process was performed at 3.9 torr and at 350° C.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. An apparatus for forming a protective self aligned buffer (PSAB) layer within a metal layer in a partially fabricated semiconductor device, the apparatus comprising:
   (a) a process chamber having an inlet for introduction of reactants;
   (b) a support for holding the partially fabricated semiconductor device in position during formation of the PSAB layer; and
   (c) a controller, associated with the process chamber, the controller comprising program instructions for:
      (i) contacting the partially fabricated semiconductor device with a PSAB-forming reactant, such that the PSAB-forming reactant reacts with metal atoms of the metal layer and chemically transforms the top portion of the metal layer into a first protective self-aligned buffer layer, wherein said first PSAB layer resides entirely within said metal layer;
      (ii) subsequently contacting the partially fabricated semiconductor device with a pinning reactant in a plasma discharge to form a pinned PSAB layer on or within the metal layer; and
      (iii) treating the partially fabricated device surface with $H_2$ in a plasma discharge concurrently with (ii) or after (ii).

2. The apparatus of claim 1, wherein the apparatus is a plasma enhanced chemical vapor deposition (PECVD) apparatus.

3. The apparatus of claim 1, wherein the apparatus comprises multiple processing stations in the process chamber.

4. The apparatus of claim 3, wherein the apparatus is configured for performing operation (i) in a first station, and for performing operation (ii) in a different station.

5. The apparatus of claim 1, wherein the controller instructions in (i) comprise instructions for contacting the partially fabricated semiconductor device with a PSAB-forming reactant, selected from the group consisting of $SiH_4$, $GeH_4$, $PH_3$, $B_2H_6$, $AsH_3$, $CH_4$, $C_xH_y$, $H_2S$, $H_2Se$, and $H_2Te$.

6. The apparatus of claim 1, wherein the controller instructions in (i) comprise instructions for contacting the partially fabricated semiconductor device with a PSAB-forming reactant in the absence of plasma discharge.

7. The apparatus of claim 1, wherein the controller instructions in (ii) comprise instructions for contacting the partially fabricated semiconductor device with a pinning reactant selected from the group consisting of $N_2$, $NH_3$, a hydrocarbon, a gas from the family of methyl-substituted silanes, a gas from the family of methyl-substituted amines, hexamethyldisilazane (HMDS), and mixtures thereof.

8. The apparatus of claim 7, wherein the controller instructions comprise instructions for performing (ii) and (iii) concurrently.

9. The apparatus of claim 1, wherein the controller further comprises instructions for contacting the partially fabricated semiconductor device with a nitrogen-containing reactant, wherein the nitrogen-containing reactant selectively reacts with metal atoms of the metal layer and thereby partially passivates the metal surface to the formation of the first PSAB layer, prior to (i).

10. The apparatus of claim 1, wherein the apparatus is a PECVD apparatus comprising a high frequency (HF) radio frequency (RF) power source and a low frequency (LF) radio frequency (RF) source.

11. The apparatus of claim 1, wherein the controller instructions for (i) comprise instructions for flowing a process gas comprising the PSAB-forming reactant at a flow rate ranging from about 0.001 sccm to about 10000 sccm, and maintaining process temperature in the range from about 20° C. to about 500° C., in the absence of plasma discharge.

12. An apparatus for forming a protective self aligned buffer (PSAB) layer within a metal layer in a partially fabricated semiconductor device, the apparatus comprising:
   (a) a process chamber having an inlet for introduction of reactants;
   (b) a support for holding the partially fabricated semiconductor device in position during formation of the PSAB layer; and
   (c) a controller associated with the process chamber, the controller comprising program instructions for:
      (i) contacting the partially fabricated semiconductor device with a PSAB-forming reactant, such that the PSAB-forming reactant reacts with metal atoms of the metal layer and chemically transforms the top portion of the metal layer into a first protective self-aligned buffer layer, wherein said first PSAB layer resides entirely within said metal layer;
      (ii) subsequently contacting the partially fabricated semiconductor device with a pinning process gas comprising a hydrocarbon in a plasma discharge to form a pinned PSAB layer on or within the metal layer.

13. The apparatus of claim 12, wherein the apparatus is a plasma enhanced chemical vapor deposition (PECVD) apparatus.

14. The apparatus of claim 12, wherein the apparatus comprises multiple processing stations in the process chamber.

15. The apparatus of claim 14, wherein the apparatus is configured for performing operation (i) in a first station, and operation (ii) in a different station.

16. The apparatus of claim 12, wherein the controller instructions in (i) comprise instructions for contacting the partially fabricated semiconductor device with a PSAB-forming reactant, selected from the group consisting of SiH4, GeH4, PH3, B2H6, AsH3, CH4, CxHy, H2S, H2Se, and H2Te.

17. The apparatus of claim 12, wherein the controller instructions in (i) comprise instructions for contacting the partially fabricated semiconductor device with a PSAB-forming reactant in the absence of plasma discharge.

18. The apparatus of claim 12, wherein the controller instructions in (ii) comprise instructions for contacting the partially fabricated semiconductor device with a hydrocarbon selected from the group consisting of methane, ethane, ethylene, acetylene, propane, propene, propyne, cyclopropane, cyclobutane, butanes, butenes, butynes, and benzene.

19. The apparatus of claim 12, wherein the apparatus is a PECVD apparatus comprising a high frequency (HF) radio frequency (RF) power source and a low frequency (LF) radio frequency (RF) source, and wherein instructions for (ii) comprise instructions for generating HF RF and LF RF plasma.

20. The apparatus of claim 12, wherein the controller further comprises instructions for contacting the partially fabricated semiconductor device with a nitrogen-containing reactant, wherein the nitrogen-containing reactant selectively reacts with metal atoms of the metal layer and thereby partially passivates the metal surface to the formation of the first PSAB layer, prior to (i).

* * * * *